United States Patent
Kobayashi

(10) Patent No.: US 6,263,477 B1
(45) Date of Patent: *Jul. 17, 2001

(54) LAYOUT INFORMATION GENERATING APPARATUS AND METHOD THEREOF

(75) Inventor: Naohiro Kobayashi, Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/023,765

(22) Filed: Feb. 13, 1998

(30) Foreign Application Priority Data

Feb. 13, 1997 (JP) .................................................. 9-044728

(51) Int. Cl.$^7$ ...................................................... G11C 13/00
(52) U.S. Cl. .............................................. 716/5; 365/218
(58) Field of Search ........................... 364/488, 489, 364/490, 491; 395/500; 365/218; 716/11, 5

(56) References Cited

U.S. PATENT DOCUMENTS

| | | | | |
|---|---|---|---|---|
| 4,701,860 | * | 10/1987 | Mader ..................... | 364/490 |
| 5,237,669 | * | 8/1993 | Spear et al. ............. | 395/400 |
| 5,348,558 | * | 9/1994 | Ito et al. ................ | 364/491 |
| 5,577,213 | * | 11/1996 | Avery et al. ............ | 395/280 |
| 5,784,327 | * | 7/1998 | Hazani .................... | 365/218 |
| 5,956,741 | * | 9/1999 | Jones ..................... | 716/11 |

FOREIGN PATENT DOCUMENTS

| | | |
|---|---|---|
| 56152068 | 11/1981 | (JP) . |
| 5-314215 | 11/1993 | (JP) . |
| 6-110975 | 4/1994 | (JP) . |
| 6-139309 | 5/1994 | (JP) . |
| 6-176105 | 6/1994 | (JP) . |
| 6-215069 | 8/1994 | (JP) . |
| 7-182386 | 7/1995 | (JP) . |
| 9-179899 | 7/1997 | (JP) . |

* cited by examiner

Primary Examiner—Matthew Smith
Assistant Examiner—Thuan Do
(74) Attorney, Agent, or Firm—Foley & Lardner

(57) ABSTRACT

Information for defining a structure of an address bit arrangement of a ROM portion of layout data is affixed, by means of text data as a discriminator, to a typical ROM cell portion indicating a characteristic of the address bit arrangement. Layout data including the affixed information is read in. ROM coordinate information and the text data are extracted. A ROM definition for generating a mask pattern is generated from the extracted ROM coordinate information based on ROM data. Thus, the layout information generating apparatus extracts the arrangement information and coordinate information of a ROM portion automatically, not manually, to generate a ROM definition, thereby considerably decreasing the number of steps to improve productivity.

4 Claims, 34 Drawing Sheets

FIG. 5 (PRIOR ART)

| ROM ADDRESS VALUE | | | | | POSITION (SELECT SIGNAL LINE) | | COORDINATES | |
|---|---|---|---|---|---|---|---|---|
| A4 | A3 | A2 | A1 | A0 | | | | |
| 0 | 0 | 0 | 0 | 0 | X0 | Y0 | x_0 | y_0 |
| 0 | 0 | 0 | 0 | 1 | X1 | Y0 | x_1 | y_0 |
| 0 | 0 | 0 | 1 | 0 | X2 | Y0 | x_2 | y_0 |
| | | | | | · · · · | · · · · | · · · · | · · · · |
| 1 | 1 | 1 | 1 | 0 | X2 | Y7 | x_2 | y_7 |
| 1 | 1 | 1 | 1 | 1 | X3 | Y7 | x_3 | y_7 |

FIG. 7 (PRIOR ART)

| | | (COORDINATES) | ADDRESS BIT | | | |
|---|---|---|---|---|---|---|
| BASE | | X, Y, | 0, 0 | | | (DEFINITION OF REFERENCE POINT) |
| | (LEVEL) | (DIRECTION) (PITCH) | (NUMBER) | (ADDRESS PITCH) | | |
| ARRAY | 0, | X, X_p, | 4, | 1 | | (DEFINITION OF FIRST ARRAY) |
| ARRAY | 1, | Y, Y_p, | 8, | 4 | | (DEFINITION OF SECOND ARRAY) |

FIG.10 (PRIOR ART)

| ROM CELL | BIT OUTPUT B0 |
|---|---|
| | ADDRESS SIGNAL A<br>4 3 2 1 0 |
| Y0 · X0 | 0 0 0 0 0 |
| Y0 · X1 | 0 0 0 0 1 |
| Y0 · X2 | 0 0 0 1 0 |
| Y0 · X3 | 0 0 0 1 1 |
| Y1 · X0 | 0 0 1 0 0 |
| ⋮ | ⋮ |
| Y7 · X3 | 1 1 1 1 1 |

FIG. 11 (PRIOR ART)

| SELECT SIGNAL LINE NAME | ADDRESS SIGNAL A 4 3 2 1 0 | Y COORDINATE | X COORDINATE |
|---|---|---|---|
| Y0 | 0 0 0 - - | Y | — |
| Y1 | 0 0 1 - - | Y+1*Yp | — |
| Y2 | 0 1 0 - - | Y+2*Yp | — |
| Y3 | 0 1 1 - - | Y+3*Yp | — |
| Y4 | 1 0 0 - - | Y+4*Yp | — |
| Y5 | 1 0 1 - - | Y+5*Yp | — |
| Y6 | 1 1 0 - - | Y+6*Yp | — |
| Y7 | 1 1 1 - - | Y+7*Yp | — |
| X0 | - - - 0 0 | — | X |
| X1 | - - - 0 1 | — | X+1*Xp |
| X2 | - - - 1 0 | — | X+2*Xp |
| X3 | - - - 1 1 | — | X+3*Xp |

FIG. 12 (PRIOR ART)

| BIT OUTPUT B0 | | |
|---|---|---|
| ROM CELL | Y COORDINATE | X COORDINATE |
| Y0・X0 | $Y+0*Yp$ | $X+0*Xp$ |
| Y0・X1 | $Y+0*Yp$ | $X+1*Xp$ |
| Y0・X2 | $Y+0*Yp$ | $X+2*Xp$ |
| Y0・X3 | $Y+0*Yp$ | $X+3*Xp$ |
| Y1・X0 | $Y+1*Yp$ | $X+0*Xp$ |
| ⋮ | ⋮ | ⋮ |
| Y7・X3 | $Y+7*Yp$ | $X+3*Xp$ |

ARRAY 2, Y, Yp1, 8, 4

FIG. 29

| BASE  | Xg, | Yg,  | 0,  | 0  |
|-------|-----|------|-----|----|
| ARRAY | 1,  | X,   | Xp1,| 4, | 1  |
| ARRAY | 2,  | Y,   | Yp1,| 8, | 4  |
| ARRAY | 3,  | X,   | Xp2,| 2, | 32 |

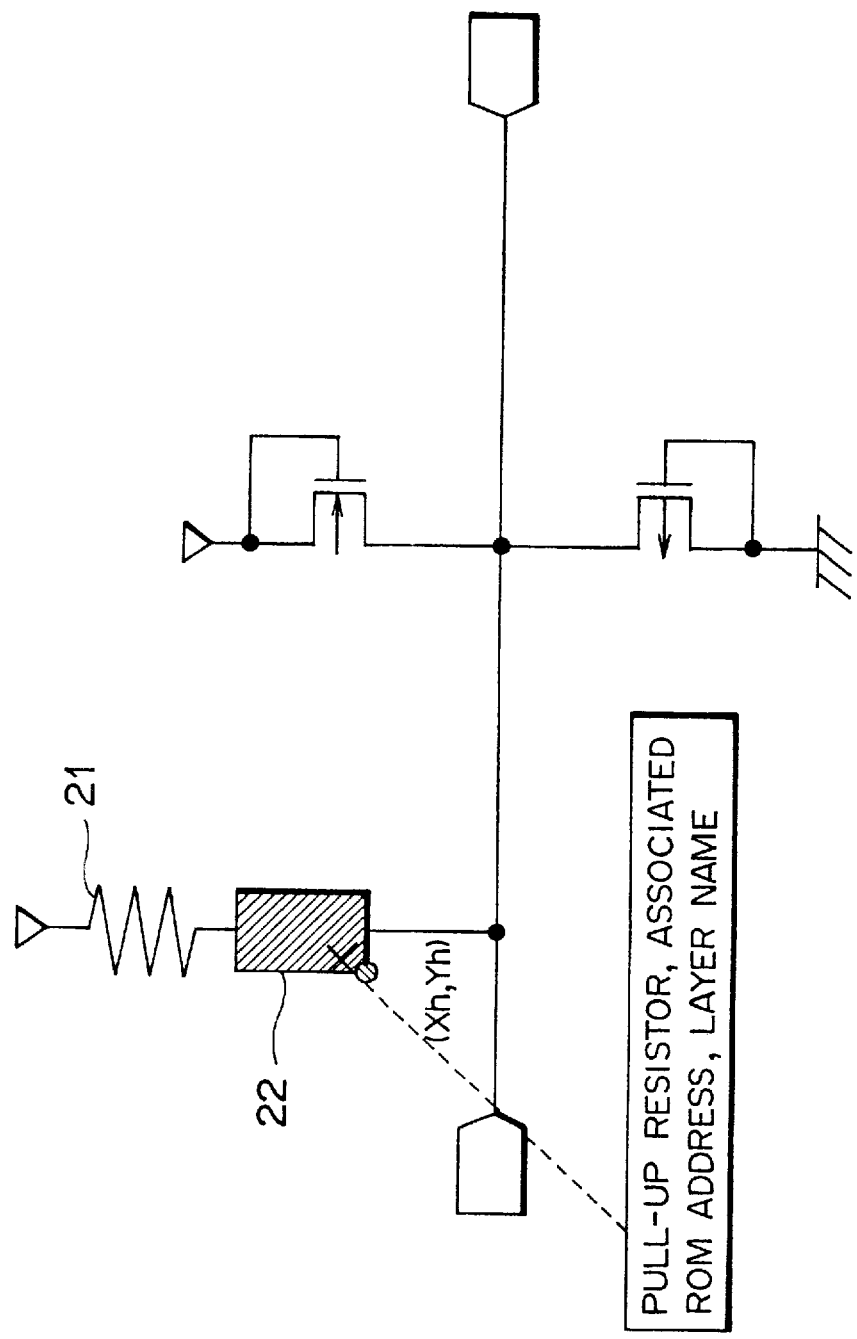

LAYOUT INFORMATION GENERATING APPARATUS AND METHOD THEREOF

BACKGROUND OF THE INVENTION

1. Field of the Invention

The present invention relates to an apparatus and method of generating layout information, and, more particularly, to a layout information generating apparatus and method which generate information for writing ROM (Read Only Memory) codes and a mask option in a semiconductor integrated circuit incorporating a mask ROM.

2. Description of the Related Art

The background of the present invention will be discussed prior to a discussion of the related art. FIG. 1 is a diagram showing the structure for one bit of a 32-word ROM. Referring to FIG. 1, first, a description will be given of the structure of a ROM layout section which is the premise of the art relating to a layout information generating apparatus.

With reference to FIG. 1, of an address signal of five bits $A_0$ to $A_4$, $A_0$ and $A_1$ are input to an X decoder 32 to select one of select signal line $X_0$ to $X_3$ in the X-coordinate direction. Likewise, $A_2$ to $A_4$ in the 5-bit address signal $A_0$–$A_4$ are input to an Y decoder 31 to select one of select signal lines $Y_0$ to $Y_7$ in the Y-coordinate direction. A ROM is constructed by laying out cell blocks 33 at the intersections of the thus constituted select signal lines in the X-coordinate direction and the Y-coordinate direction to set ROM cells, and leading out the existence/non-existence of each cell block 33 or ROM cell as a bit output B0.

In this case, whether the cell block 33 is laid out when a logic value is "1" or when it is "0" is determined by the circuit structure and the fabrication process. In the following description, it is assumed that the cell block 33 is laid out when a logic value is "1" and it is not when the logic value is "0." It is "ROM data" that is the original data of this layout and that has a sequence of "0" and "1" (for the length of the address). The ROM data is generally expressed by a hexadecimal (16) notation from the viewpoint of management.

A description will now be given of the structure of a mask option which is the premise of the art relating to a layout information generating apparatus. The "mask option" is an option which is the other portion than the ROM and which can be selected by a user. The mask option includes an option for whether or not a pull-up resistor is present, switching between pull-up and pull-down, etc. While this portion is intrinsically irrelevant to ROM data, the set value of the mask option is designated, together with input ROM data, in the case of a ROM-incorporated microcomputer product.

FIG. 2 is a diagram exemplifying the circuit structure of a part of a chip with a designated mask option portion. Referring to FIG. 2, a pull-up resistor 21 is preset, and it is determined if the pull-up resistor 21 should be reflected on the circuit, depending on whether or not a cell (hereinafter called "dummy cell") 22 is to be generated.

When the presence of the pull-up resistor is designated by a mask option designation field in an input ROM code, the dummy cell 22 is laid out and the pull-up resistor is reflected on the circuit as shown in FIG. 3. In the case of no pull-up resistor, the dummy cell 22 is not laid out and the pull-up resistor is not reflected on the circuit as shown in FIG. 4.

A description will now be given of the structure of a ROM definition and a mask option definition which are the premise of the art relating to a layout information generating apparatus.

Laying out ROM cells and dummy cells for the mask option in accordance with ROM data previously requires the position and coordinate information of the ROM cells and mask option dummy cells for an input address.

In the case of the ROM structure which has been discussed referring to FIG. 1, the position (select signal line) and coordinate information of ROM cells with respect to an input from the input address $A_0$–$A_4$ as shown in, for example, FIG. 5.

The correlation shown in FIG. 5 is called a ROM definition which needs records by the number of ROM cells (one record consists of an address value and position information (select signal)). The memory capacity therefore becomes larger in proportion to the size of the ROM.

To reduce the memory capacity, an attempt has been made to compress a ROM definition by expressing the ROM definition in an array form by extracting and grouping ROM cells whose coordinate pitches and address pitches between adjoining ROM cells are identical.

Suppose that there is a ROM group consisting of 32 ROM cells as shown in FIG. 6. The numerals in the individual cells in the diagram are addresses associated with the ROM cells.

FIG. 7 illustrates the compression of a ROM definition in consideration of adjoining ROM cells. The ROM definition, which should originally need a total of 32 ROM cell records, is compressed to the size of three records. Referring to FIG. 7, the ROM definition consists of the definition of a reference point, the definition of the first array and the definition of the second array. The definition information of the reference point consists of the coordinates and address of the reference point and a bit, the first array definition includes level information (0), the direction (X direction), the pitch (X_p), the number (4), the address pitch (1) and the X-directional array, and the second array definition includes level information (1), the direction (Y direction), the pitch (Y_p), the number (8), the address pitch (4) and the Y-directional array.

In the actual layout, the contents of those definitions are used directly or after development.

Likewise, a mask option requires an associated address and the position and coordinate information of dummy cells, which are called a mask option definition. Since its correlation table and the like are the same as those for the ROM definition, their description will be omitted.

On the premise that the above-described related art is understood, first prior art will be discussed below. FIG. 8 is a block diagram showing the structure of the first prior art, and FIG. 9 is a flowchart for explaining a process sequence according to the first prior art. Referring to FIG. 8, this conventional apparatus comprises a PROM (Programmable ROM) reader 1, a ROM code input controller 2, a screen display controller 3, a display 4, a data processor 5, a layout information storage 6, a keyboard controller 7 and a keyboard 8.

The operation of the first prior art will be described with reference to the block diagram of FIG. 8, the flowchart of FIG. 9, the structural diagram for one bit of a ROM in FIG. 1 and the structural diagram of the pull-up resistor portion of a mask option in FIG. 2.

To begin with, assuming that all the ROM cells are laid out and all the dummy cells of a mask option are laid out, a designer analyzes the design of the circuits to be laid out and the layout pattern. With regard to the ROM section, the arrangement of the X decoder and Y decoder is analyzed for each bit output, and the address of each ROM cell and bit arrangement information are extracted as address signal values (step S301), as shown in FIG. 10.

Next, layout coordinate information is extracted based on the layout coordinates (X, Y) of a reference point 34 (see FIG. 1) as the reference point of one of ROM cells on the layout pattern, and the relative positional relationship among the individual ROM cells, which shows the distance from the reference point 34 computed from a pitch 35 ($Y_P$) and a pitch 36 ($X_P$) between ROM cells and the layout number, as shown in FIG. 11, (step S302). For example, information is extracted which indicates that a select signal line Y1 is selected when $A_4$ and $A_3$ in the address signal $A_4$–$A_0$ are 0 and $A_2$ is 1, and the Y coordinate of the ROM cell selected by this signal line $Y_1$ is Y+$Y_P$.

Subsequently, the designer associates the address bit arrangement information with coordinate information on the layout pattern for each ROM cell to prepare a table indicating bit outputs as shown in FIG. 12, and the table is supplied, together with a size 37 ($Y_N$) and a size 38 ($X_S$) of a cell block to be laid out, to the data processor 5 through the keyboard 8 (step S303).

With regard to an mask option, likewise, on the assumption that all the dummy cells are laid out, the designer performs the arrangement of the dummy cells of the mask option and extraction of the coordinates by referring to the design of the circuits to be laid out and the layout pattern (step S301').

Further, the extracted cell coordinates are associated with the address bit information of the associated ROM codes to prepare a correlation table (step S302'). This table is supplied, together with information indicating whether layout is carried out when the address associated bit is 0 or 1 and information on the cell block sizes ($X_m$) and ($Y_m$), to the data processor 5 through the keyboard 8 (step S303').

The PROM code reader 1 reads a target ROM code (same as "ROM data") via the ROM code input controller 2 (step S304), and the data processor 5 rearranges the read ROM code in the order of the address bit arrangement information of the individual ROM cells and the dummy cells of the mask option to be associated with one another (step S305).

Then, the logic value of the ROM code rearranged in the order of the address bit arrangement information is checked, and when and only when this logic value is "1," the cell block 33 whose size is designated based on the layout coordinate information of the associated ROM cell is generated as a layout pattern and is stored in the layout information storage 6 (step S306).

In this step S306, for the mask option, after the logic value of the ROM code is checked, it is determined whether the mask option designates layout for the logic value of "1" or for the logic value of "0." In the case of layout being made, a cell block whose size is designated based on the layout coordinate information of the associated dummy cell of the mask option is generated as a layout pattern and is stored in the layout information storage 6.

The processing results in step S306 are displayed on the display 4 for confirmation via the screen display controller 3 (step S307).

Next, a layout generating apparatus proposed in Unexamined Japanese Patent Publication No. Hei 5-314215 will be discussed as second prior art. The second prior art is a layout generating apparatus with an improvement made on the ROM layout information generation technique of the first prior art. FIG. 13 shows its structure in a block diagram. FIG. 14 is a flowchart for explaining a process sequence according to the second prior art.

Referring to FIG. 13, this second prior art comprises a PROM reader 1, a ROM code input controller 2, a screen display controller 3, a display 4, a data processor 5, a layout information storage 6, a keyboard controller 7, a keyboard 8, a ROM position information extractor 9, a layout inspecting section 12, and a logic simulation executing section 13. The operation of the second prior art will be discussed with reference to the block diagram of FIG. 13 and the flowchart of FIG. 14.

First, logic circuit diagram data is read in (step S401). Then, layout pattern data is read (step S402), and test pattern data is read (step S403). Further, a ROM code is read (step S404).

Next, the logic simulation executing section 13 prepares the address bit arrangement information of each ROM cell by using the read logic circuit diagram data, test pattern data and ROM code (step S405).

Then, the layout inspecting section 12 prepares the coordinate information of each ROM cell by using the logic circuit diagram data and layout pattern (step S406).

Then, the ROM position information extractor 9 associates the address bit arrangement information of each ROM cell with the coordinate information (step S407) and the associated address bit arrangement information and coordinate information are rearranged in the order of the address bit arrangement information in association with the ROM code (step S408).

When and only when the logic value of the rearranged ROM code is "1," a cell block with the size designated by a key operation on the keyboard 8 under the control of the keyboard controller 7 is separately output for the associated coordinates, so that the data processor 5 generates a layout pattern which is in turn stored in the layout information storage 6 (step S409). Then, the generated layout pattern is checked (step S410).

The second prior art differs from the first prior art in that the second prior art additionally comprises the ROM position information extractor 9, the layout inspecting section 12 and the logic simulation executing section 13 which are not included in the first prior art. This difference results in such an improvement that address bit arrangement information and coordinate information are automatically generated by the logic simulation and layout inspection.

The second prior art, however, has made no improvement on a mask option which has been discussed in the previous section of the first prior art.

Now, a mask pattern generating apparatus proposed in Unexamined Japanese Patent Publication No. Hei 6-215069 will be discussed as third prior art. This third prior art is a mask pattern generating apparatus with an improvement made on the ROM layout information generation technique of the first prior art. FIGS. 15 and 16 show the structure of the apparatus in a block diagram. FIG. 17 is a flowchart for explaining a process sequence of the third prior art. FIG. 17 is a flowchart associated with a process of extracting ROM coordinate information and acquiring associated ROM address information, and FIG. 16 is a diagram of a system structure with respect to FIG. 15.

Referring to FIGS. 15 and 16, this third prior art comprises a ROM coordinate extractor 106 for extracting ROM coordinate information from a chip layout data file 105, a ROM address information reader 107 which receives ROM address information, and a mask pattern generator 109 for generating a mask pattern based on chip layout data 1, ROM coordinate information extracted by the ROM coordinate extractor 106, ROM address information and ROM data from a ROM data file 108. The processing according to the third prior art will be discussed below with reference to the block diagrams of FIGS. 15 and 16 and the flowchart of FIG. 17.

In step S501, a CPU 102 receives a layout cell name. Then, the CPU 102 obtains, from chip layout data stored in a storage device 103, ROM coordinate information which has a layout cell name matching with the one received in step S501 (step S502). The CPU 102 also receives ROM address information corresponding to the ROM coordinate information (step S503). Then, the CPU 102 determines if the address information is adequate based on a layout cell repeat number included in the ROM coordinate information obtained in step S502 (step S504). When the address information is checked OK instep S504, the CPU 102 proceeds to step S505 to determine if there is any other layout cell whose address information should be received. When there is no such layout cell found in step S505, the entire processing is terminated.

A method of automatically extracting address information as a modification of the third prior art (see the second embodiment in the aforementioned Unexamined Japanese Patent Publication No. Hei 6-215069), will now be discussed by referring to the flowchart in FIG. 18.

In step S601, the CPU 102 receives the name of a layout cell which constitutes the memory array portion. The CPU 102 extracts ROM coordinate information m the chip layout data based on the layout cell name (step S602). The CPU 102 determines if any other layout cell is present (step S603). When there is a further layout cell in step S603 (Yes in step S603), the processes in steps S601 and S602 are repeated.

When there is no further layout cell found in step S603, the CPU 102 accepts an input of an address decoder name, extracts the circuit connection information of the decoder portion from the decoder name and chip layout data, and executes logic simulation using the circuit connection information to extract ROM address information (step S604).

Finally, the CPU 102 stores the ROM coordinate information and ROM address information in the storage device 103 and then terminates the processing.

The third prior art differs from the first prior art in that the third prior art additionally comprises the ROM coordinate extractor 106 and ROM address information reader 107, which are not included in the first prior art. The additional structure provides such an improvement that ROM coordinate information for an input cell is automatically generated.

The processing according to the third prior art, which has been discussed with reference to FIG. 18, has made an improvement in that ROM address information is automatically extracted from the input address decoder name and the chip layout data by performing logic simulation.

In the processing system which has been discussed with reference to FIG. 17, the second prior art, address information is input manually as done conventionally, and this third prior art has made no improvement on a mask option which has been discussed in the section of the first prior art.

As apparent from the above, the above-described prior arts have the following shortcomings.

(1) The first prior art requires a great number of processing steps and significant time and faces a possible occurrence of input errors resulting from manual processing.

This is because the first prior art requires that a designer should previously prepare and input arrangement information and coordinate information of ROM cells and arrangement information and coordinate information of a mask option.

(2) The second prior art, which is intended to make an improvement on the above problem (1) by using logic simulation and layout inspection, needs that for collation between a layout pattern and logic circuit diagram data, logic circuit diagram data which expresses the whole ROM portions by transistor devices should be prepared at the time of performing layout inspection. This disadvantageously requires a large number of processing steps.

More specifically, the ROM portion in a logic circuit diagram is generally described as a functional unit, not by logic symbols and transistor devices or the like. Further, logic simulation is carried out with the ROM portion developed on a memory as an arrangement (matrix) by the number of addresses having a length equivalent to the number of output bits, so that it is necessary to prepare logic circuit diagram data which expresses the ROM portion by transistor devices. Furthermore, logic simulation based on this logic circuit information requires a time, resulting in a considerable number of processing steps and processing time.

The second prior art is designed to execute logic simulation and layout inspection on the targeted ROM portion, and is not suitable for extraction of arrangement information and coordinate information of a mask option portion arranged on the whole chip. After all, like the first prior art, the second prior art necessitates extraction of arrangement information and coordinate information through manual processing.

(3) Like the first prior art, the third prior art, which additionally comprises the ROM coordinate extractor and ROM address information reader, faces a possible occurrence of input errors or the like caused by manual processing.

This is because while the third prior art automatically extracts the coordinate information of the ROM portion, it requires manual inputting of address information.

In the modification (second embodiment) of the third prior art which accomplishes automatic extraction of address information, address information is extracted from circuit diagram information and chip layout data. This method, as mentioned above, should execute the process by developing an arrangement (matrix) by the number of addresses having a length equivalent to the number of output bits on a memory and thus requires a considerable time.

The conventional method, which extracts address information from circuit diagram information and chip layout data by using logic simulation, extracts only the address and coordinates of the target ROM portion. With regard to the mask option portion, therefore, this method needs manual extraction of arrangement information and coordinate information as per the first prior art.

SUMMARY OF THE INVENTION

Accordingly, it is an object of the present invention to provide a layout information generating apparatus and method thereof which extracts the arrangement information and coordinate information of a ROM portion automatically, not manually, to generate a ROM definition, thereby considerably decreasing the number of processing steps to improve productivity.

It is another object of this invention to provide a layout information generating apparatus and method thereof which can extract arrangement information and coordinate information even for a mask option portion without using logic simulation, thereby considerably reducing the number of processing steps and processing time to improve productivity.

To achieve the aforementioned objects, a layout information generating apparatus according to the first aspect of the present invention comprises first unit for affixing address bit information comprised of text data, as a discriminator, to a typical ROM cell portion indicating a characteristic of an address bit arrangement of a ROM portion of layout data; second unit for reading layout data including the information affixed by the first unit and extracting ROM coordinate information and the text data; and third unit for generating a ROM definition for generating a mask pattern from the extracted ROM coordinate information based on ROM data.

A layout information generating apparatus according to the second aspect of the present invention comprises first unit for affixing address bit information comprised of text data, as a discriminator, to a typical ROM cell portion indicating a characteristic of an address bit arrangement of a ROM portion of layout data; second unit for affixing text data, as a discriminator for pattern generation, to all mask option portions of layout data; third unit for reading design information and library information output from an automatic layout tool; fourth unit for reading layout data including information affixed by the first unit and the second unit and extracting ROM coordinate information, mask option coordinate information and the text data; fifth unit for specifying a mask option portion from the cell information read by the third unit and the cell information read by the fourth unit; sixth unit for generating a ROM definition for generating a ROM mask pattern based on ROM data; and seventh unit for generating a mask option definition for generating a mask pattern of a mask option.

A layout information generating method according to the third aspect of the present invention comprises the steps of (a) affixing address bit information comprised of text data, as a discriminator, to a typical ROM cell portion indicating a characteristic of an address bit arrangement of a ROM portion of layout data; (b) reading layout data including the information affixed by the step (a) and extracting ROM coordinate information and the text data; and (c) generating a ROM definition for generating a mask pattern from the extracted ROM coordinate information based on ROM data.

A layout information generating method according to the fourth aspect of the present invention comprises the steps of (a) affixing address bit information comprised of text data, as a discriminator, to a typical ROM cell portion indicating a characteristic of an address bit arrangement of a ROM portion of layout data; (b) affixing text data, as a discriminator for pattern generation, to all mask option portions of layout data; (c) reading design information and library information output from an automatic layout tool; (d) reading layout data including information affixed by the step (a) and the step (b) and extracting ROM coordinate information, mask option coordinate information and text data; (e) specifying a mask option portion from the cell information read by the step (c) and the cell information read by the step (d); (f) generating a ROM definition for generating a ROM mask pattern based on ROM data; and (g) generating a mask option definition for generating a mask pattern of a mask option.

BRIEF DESCRIPTION OF THE DRAWINGS

FIG. 5 is a diagram illustrating the correlation between position information and coordinate information of a cell of a 32-word, 1-bit ROM;

FIG. 7 is a diagram depicting a compressed ROM definition corresponding to a 32-word, 1-bit ROM;

FIG. 10 is a diagram showing address bit arrangement information of a ROM cell;

FIG. 11 is a diagram showing an address correlation table for individual ROM cells;

FIG. 12 is a diagram showing a coordinate correlation table for individual ROM cells;

FIG. 29 is a diagram exemplarily showing a ROM definition which is acquired from layout data to which all the text data are affixed in FIG. 24 for explaining the first embodiment of this invention;

FIG. 34 is a diagram exemplarily showing layout data to which text data is affixed to the circuit in FIG. 32 for a mask option for explaining the second embodiment of this invention.

DETAILED DESCRIPTION OF THE PREFERRED EMBODIMENTS

Preferred embodiments of the present invention will now be described with reference to the accompanying drawings.

Figure 1:
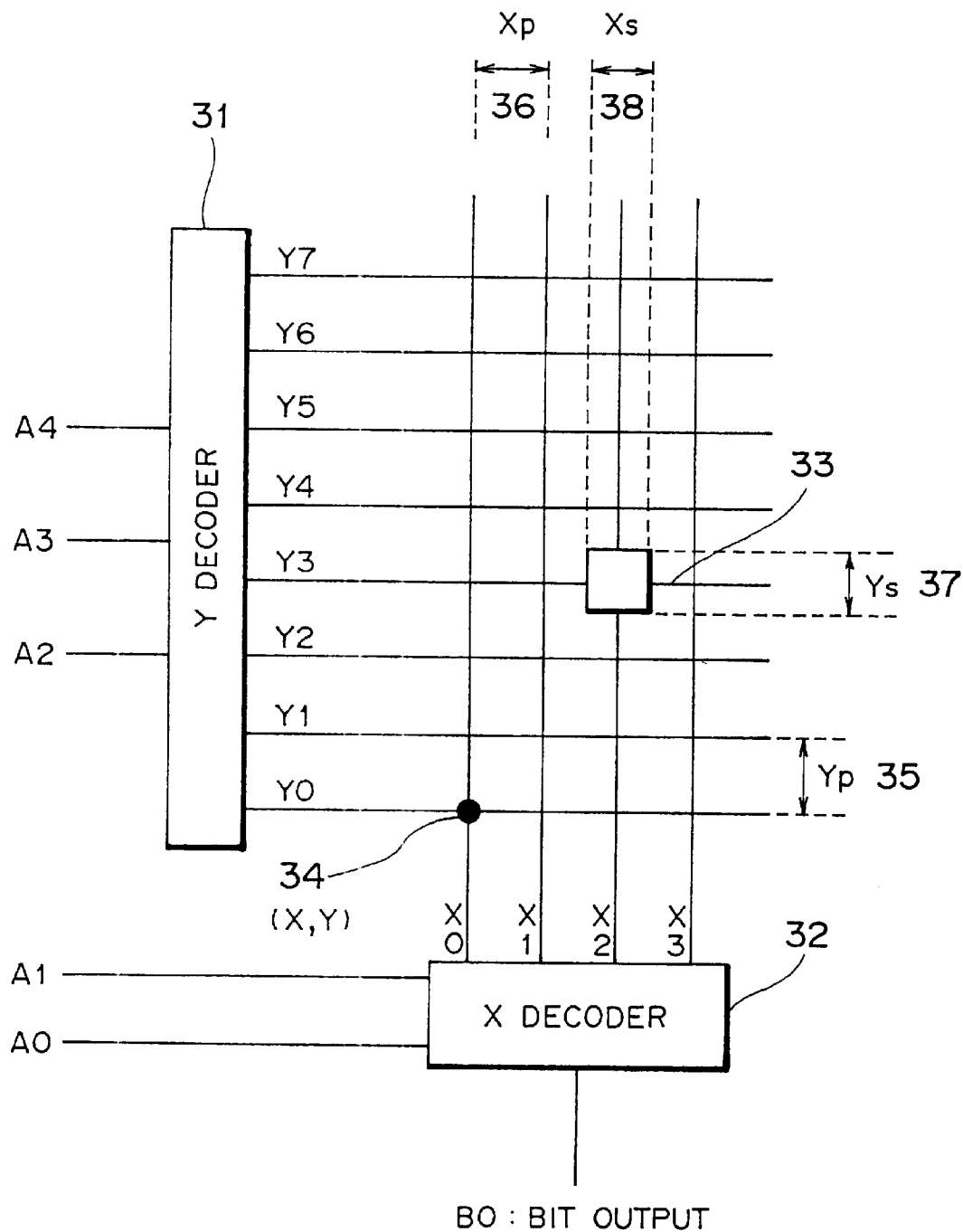
FIG. 1 is a diagram showing a one-bit structure for a 32-word ROM.
Figure 2:
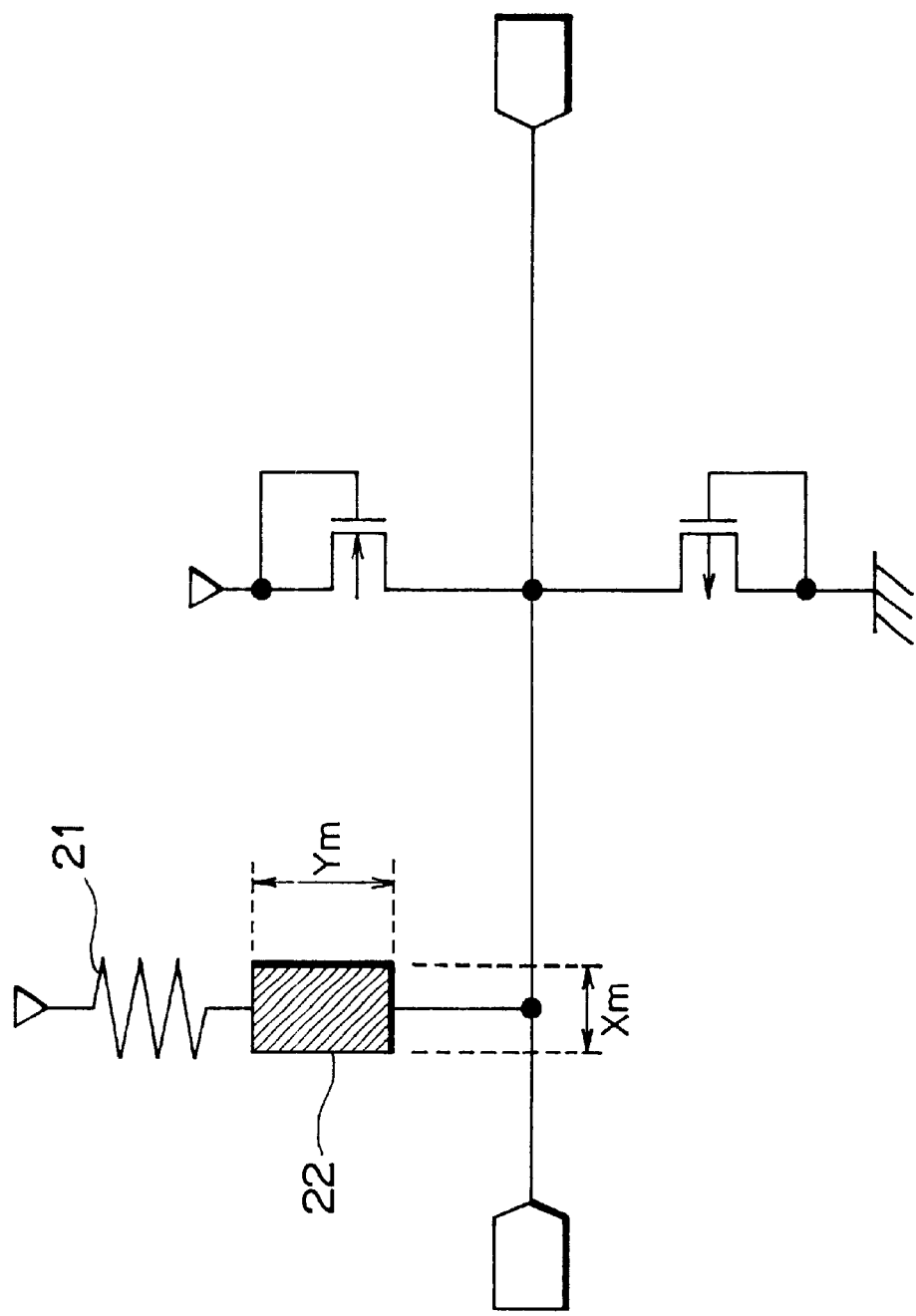
FIG. 2 is a diagram depicting the structure of a mask option for the provision or omission of a pull-up resistor.
Figure 3:
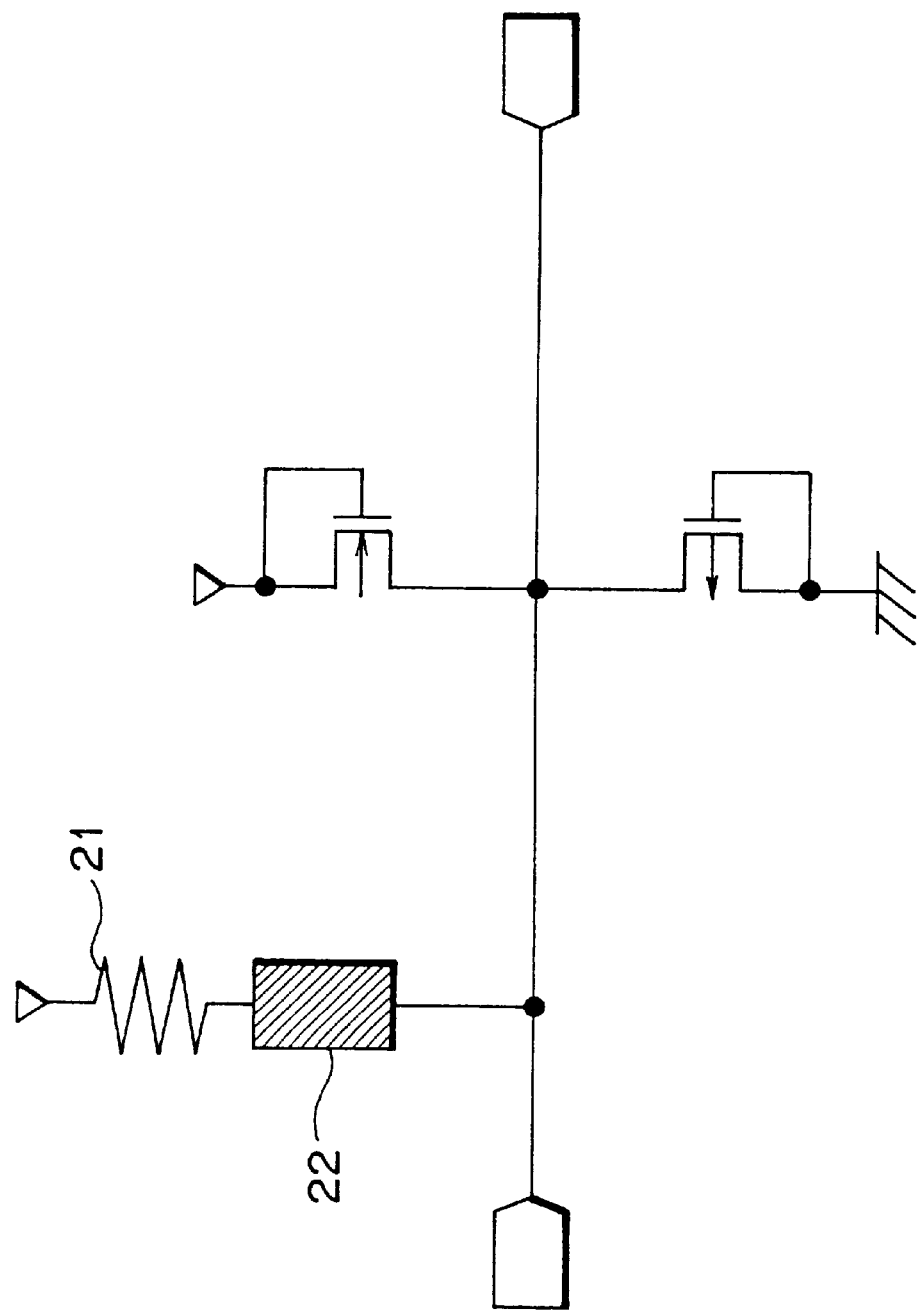
FIG. 3 is a diagram showing the structure when a dummy cell is laid out.
Figure 4:
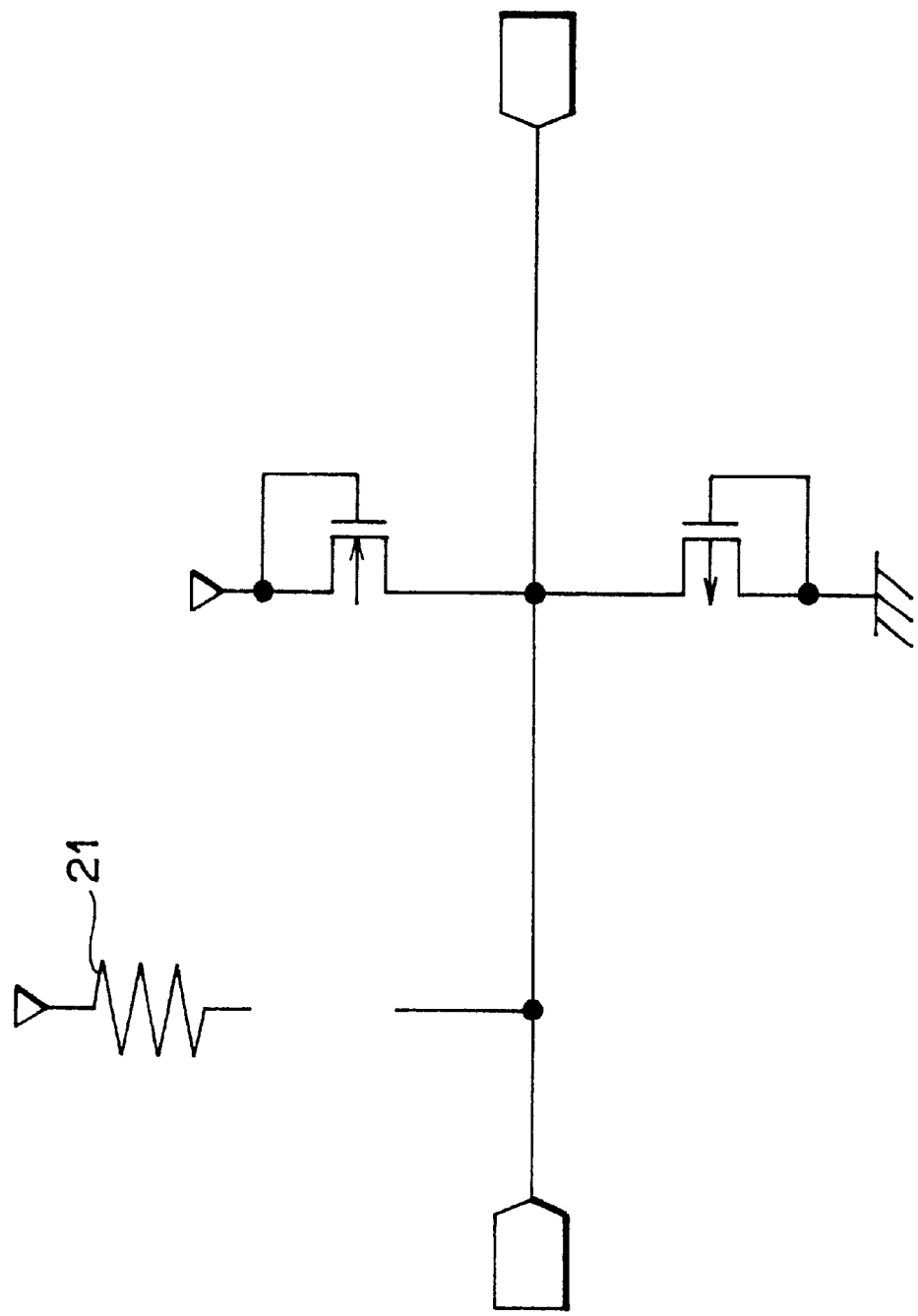
FIG. 4 is a diagram showing the structure when a dummy cell is not laid out.
Figure 6:
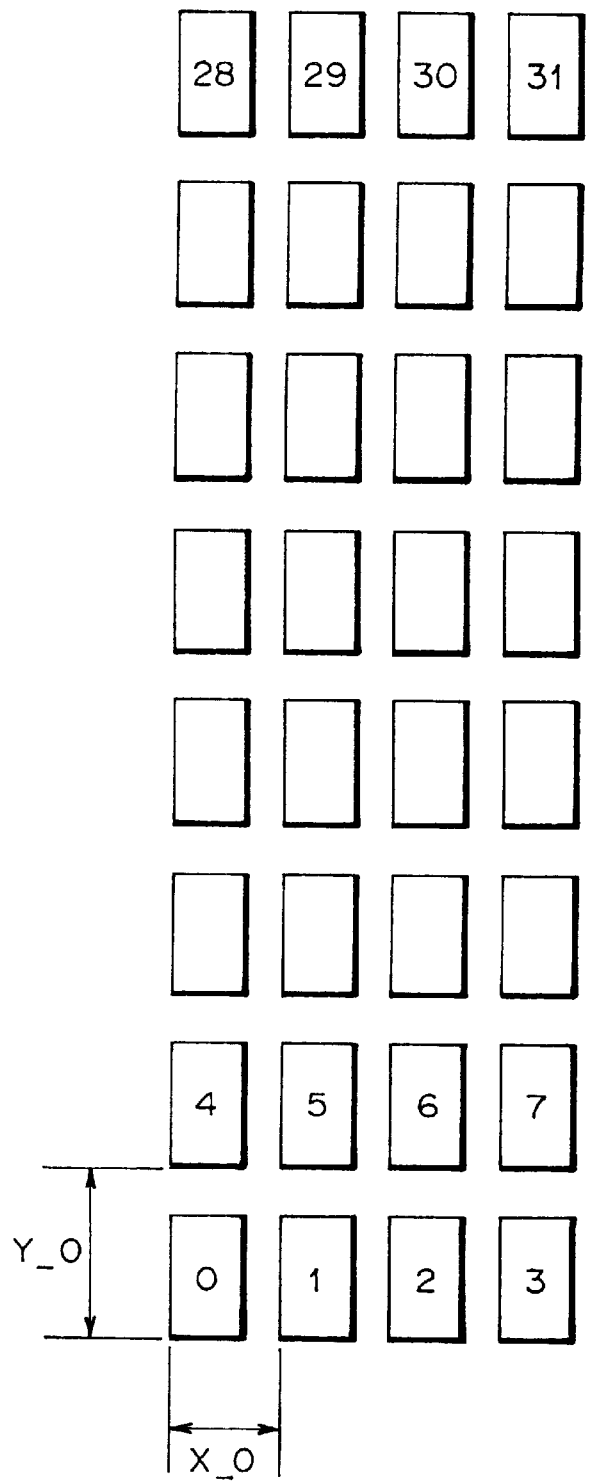
FIG. 6 is a diagram showing the structure of a 1-bit ROM of 32 words.
Figure 8:
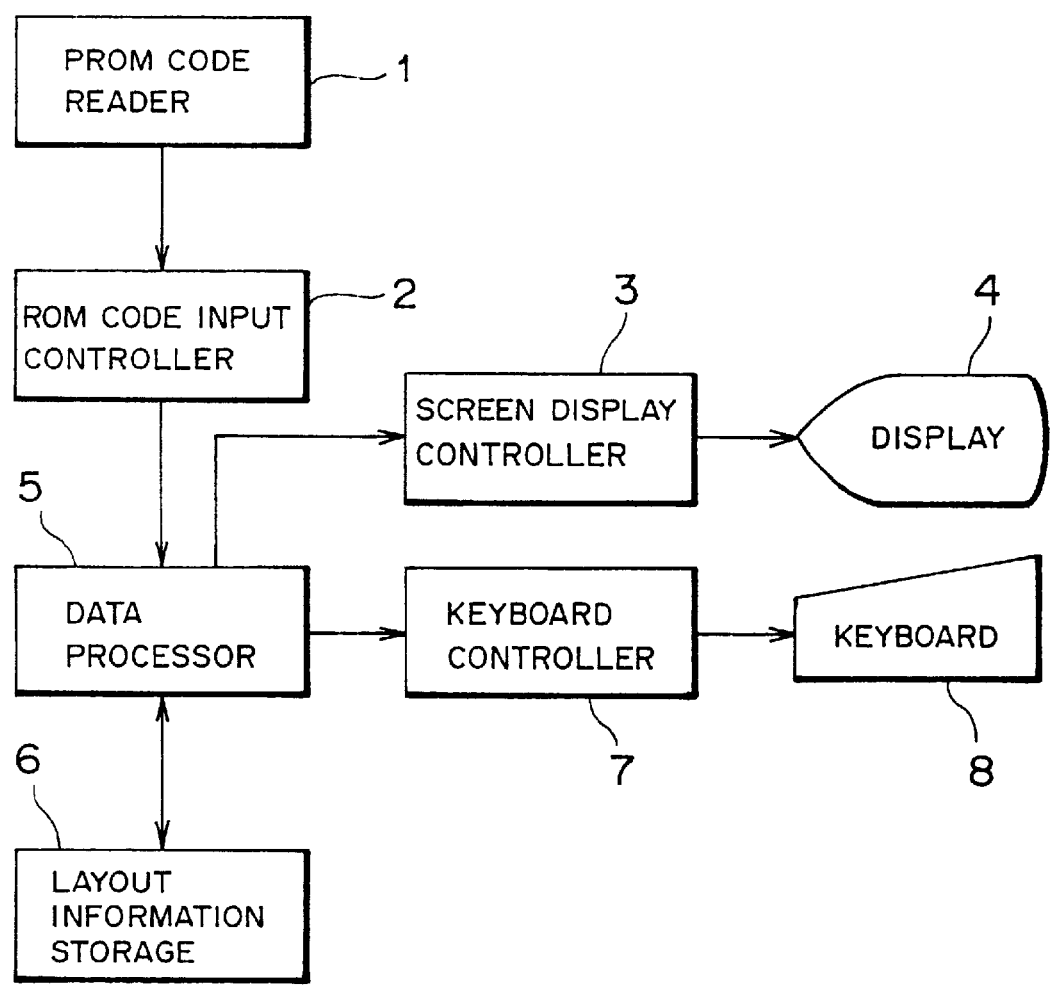
FIG. 8 is a block diagram showing the structure of the first prior art.
Figure 9:
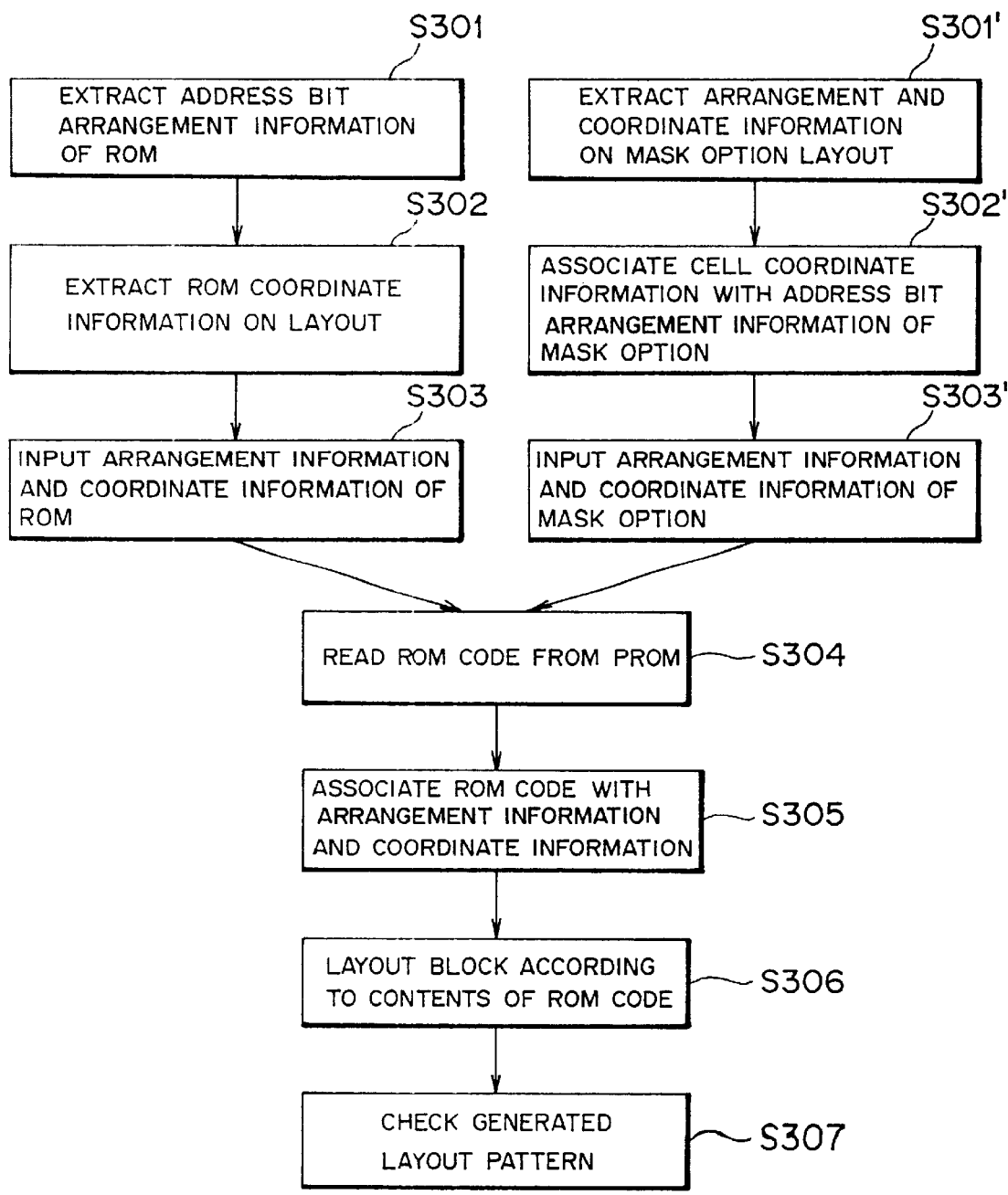
FIG. 9 is a flowchart illustrating a process flow of the first prior art.
Figure 13:
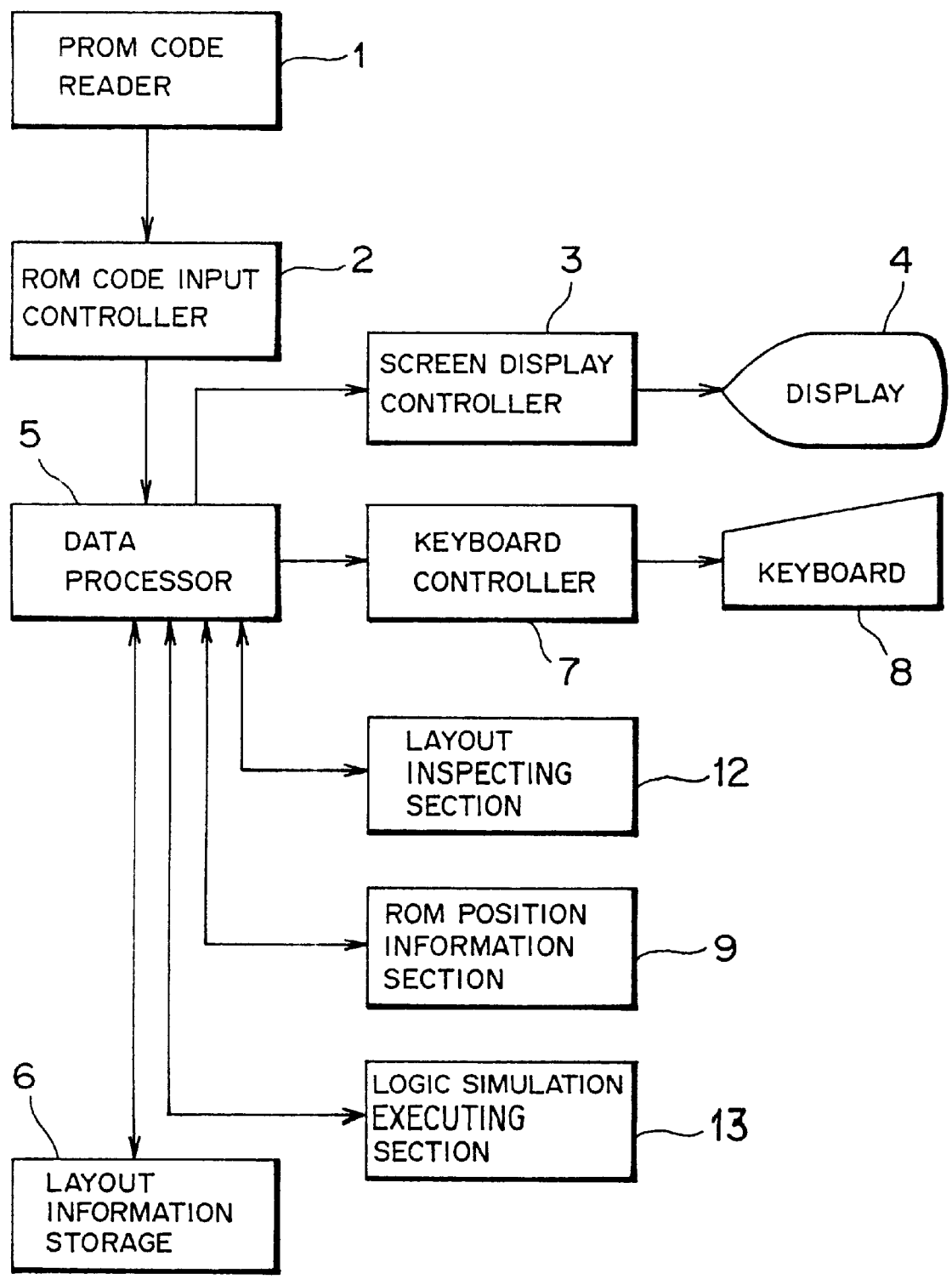
FIG. 13 is a block diagram showing the structure of the second prior art.
Figure 14:
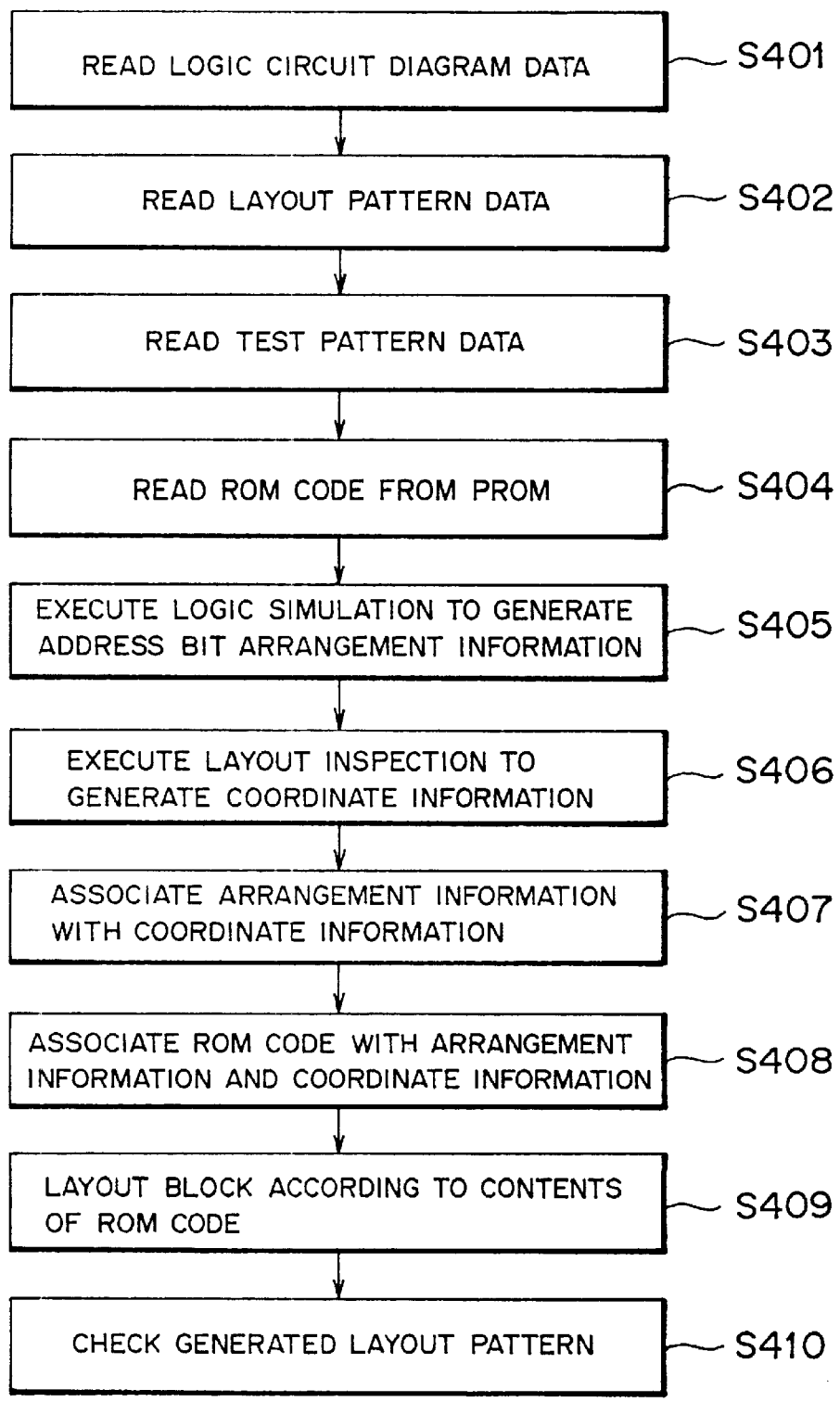
FIG. 14 is a flowchart illustrating a process flow of the second prior art.
Figure 15:
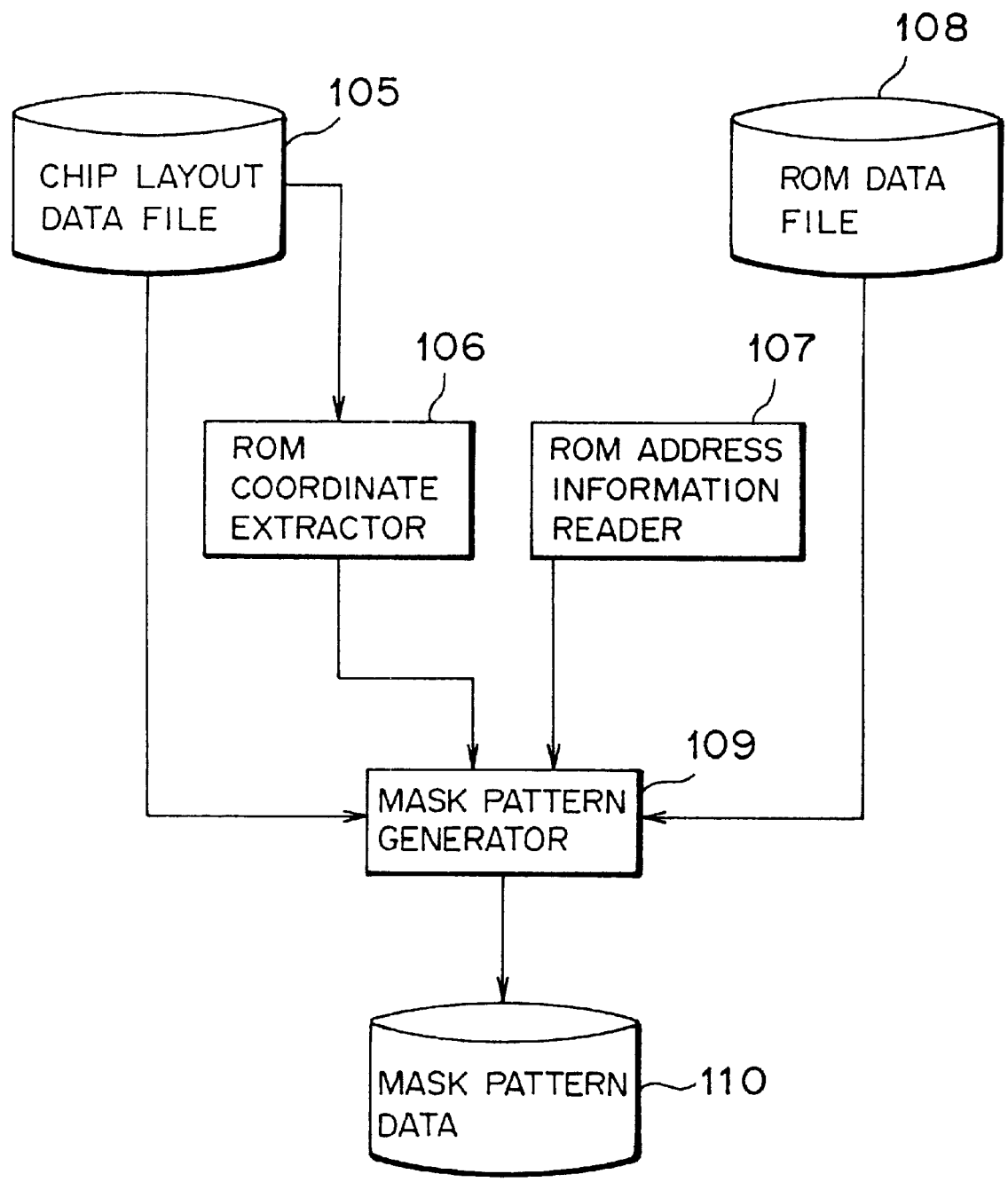
FIG. 15 is a block diagram showing the structure of the third prior art.
Figure 16:
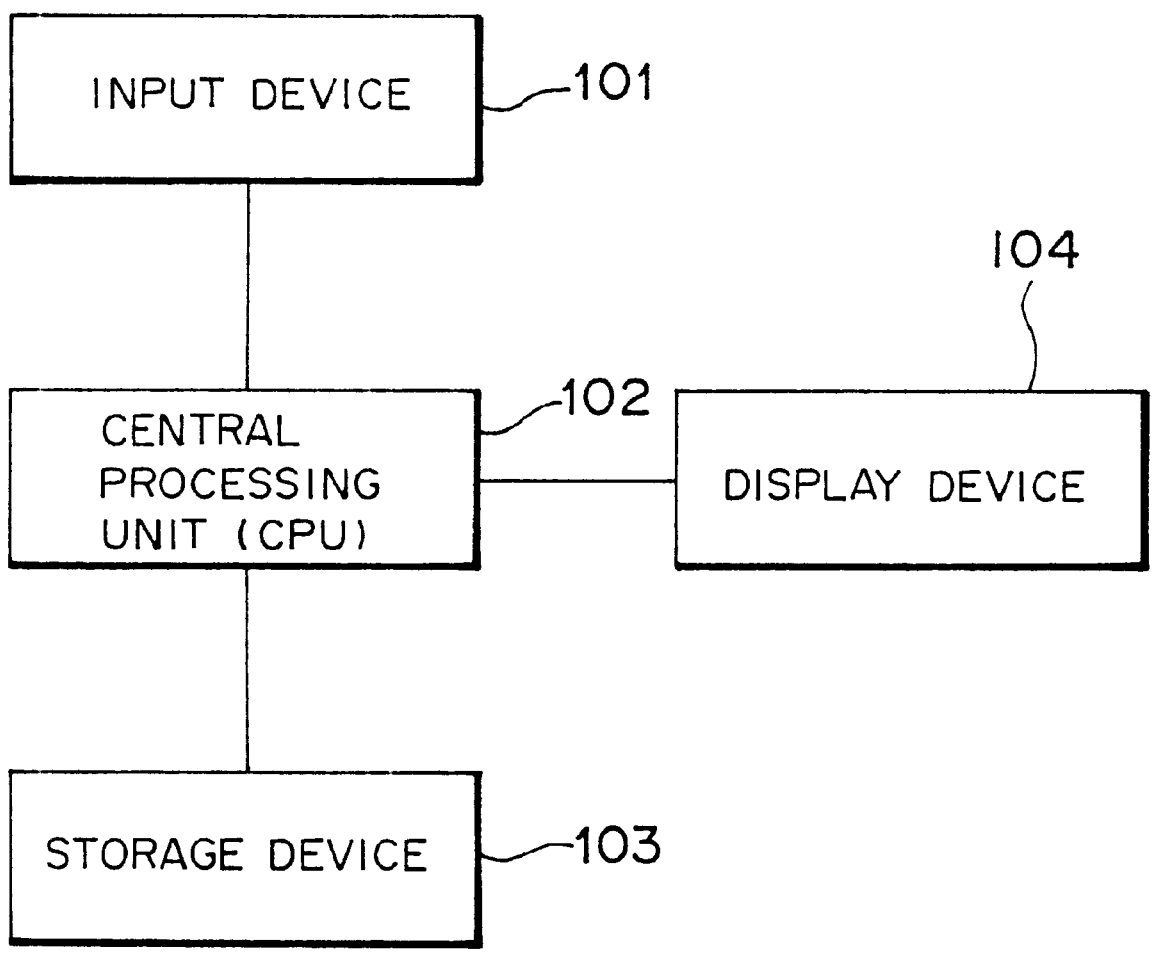
FIG. 16 is a diagram depicting the system structure of the third prior art.
Figure 17:
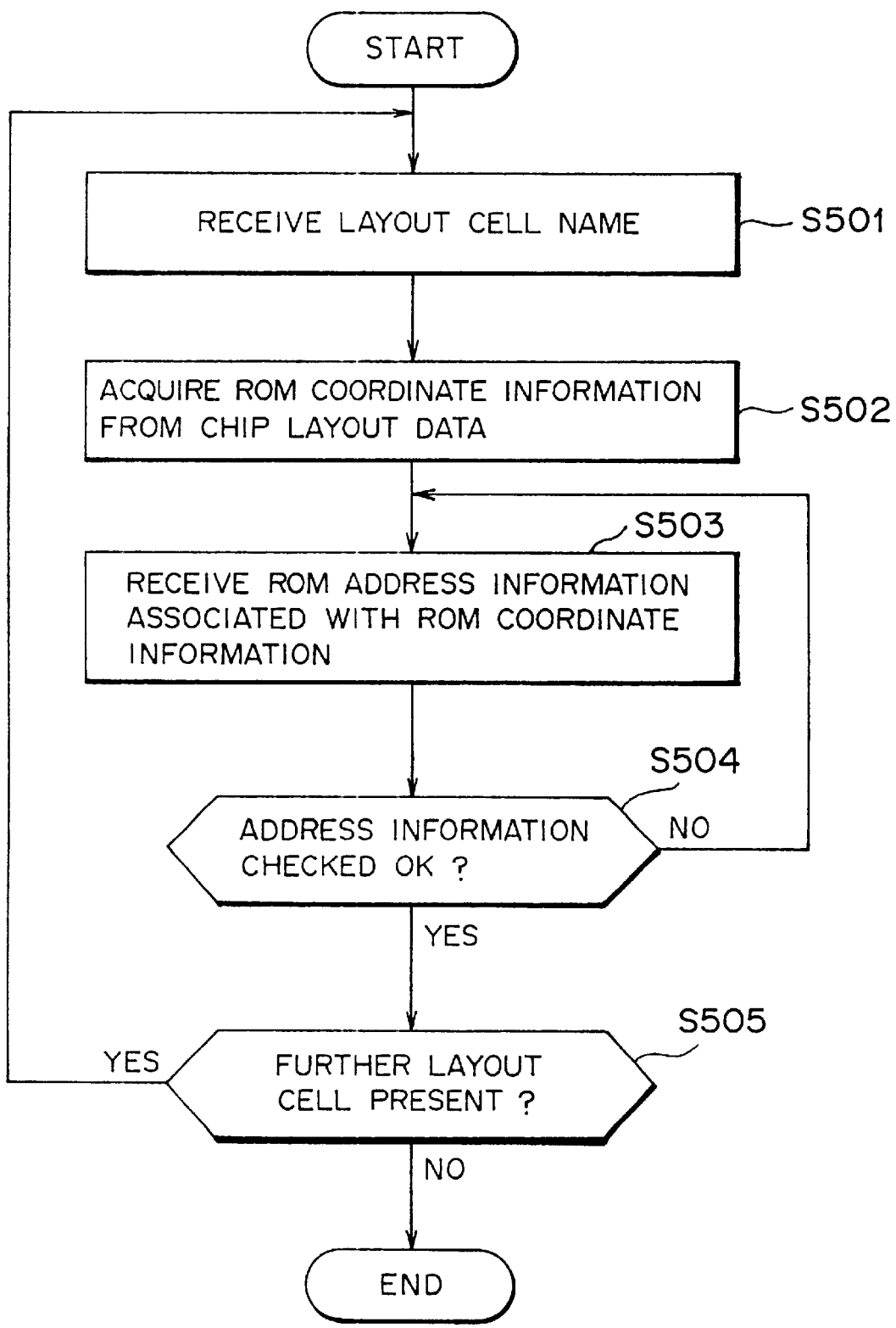
FIG. 17 is a flowchart illustrating a process flow of the third prior art.
Figure 18:
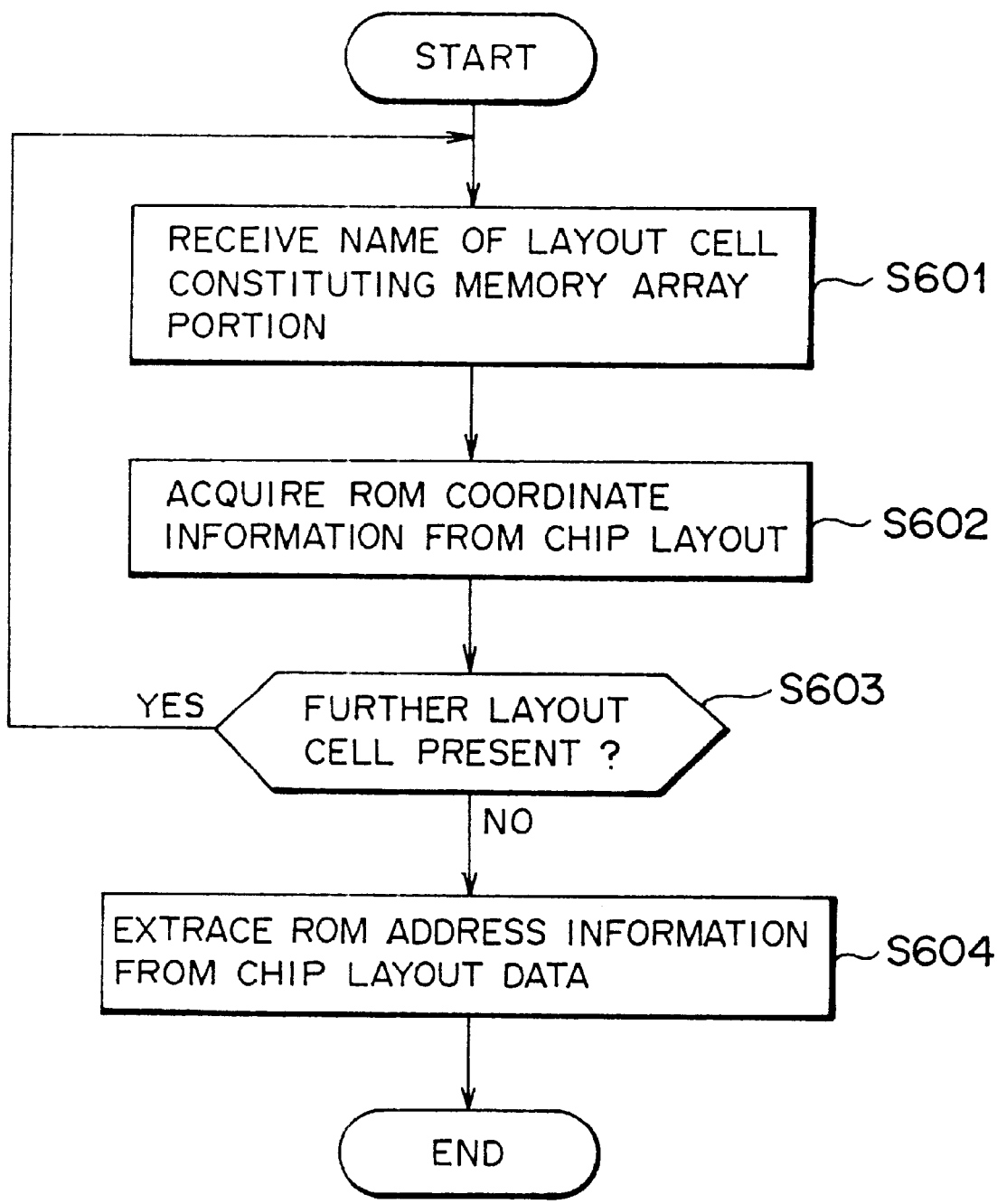
FIG. 18 is a flowchart illustrating a process flow of a modification of the third prior art.
Figure 19:
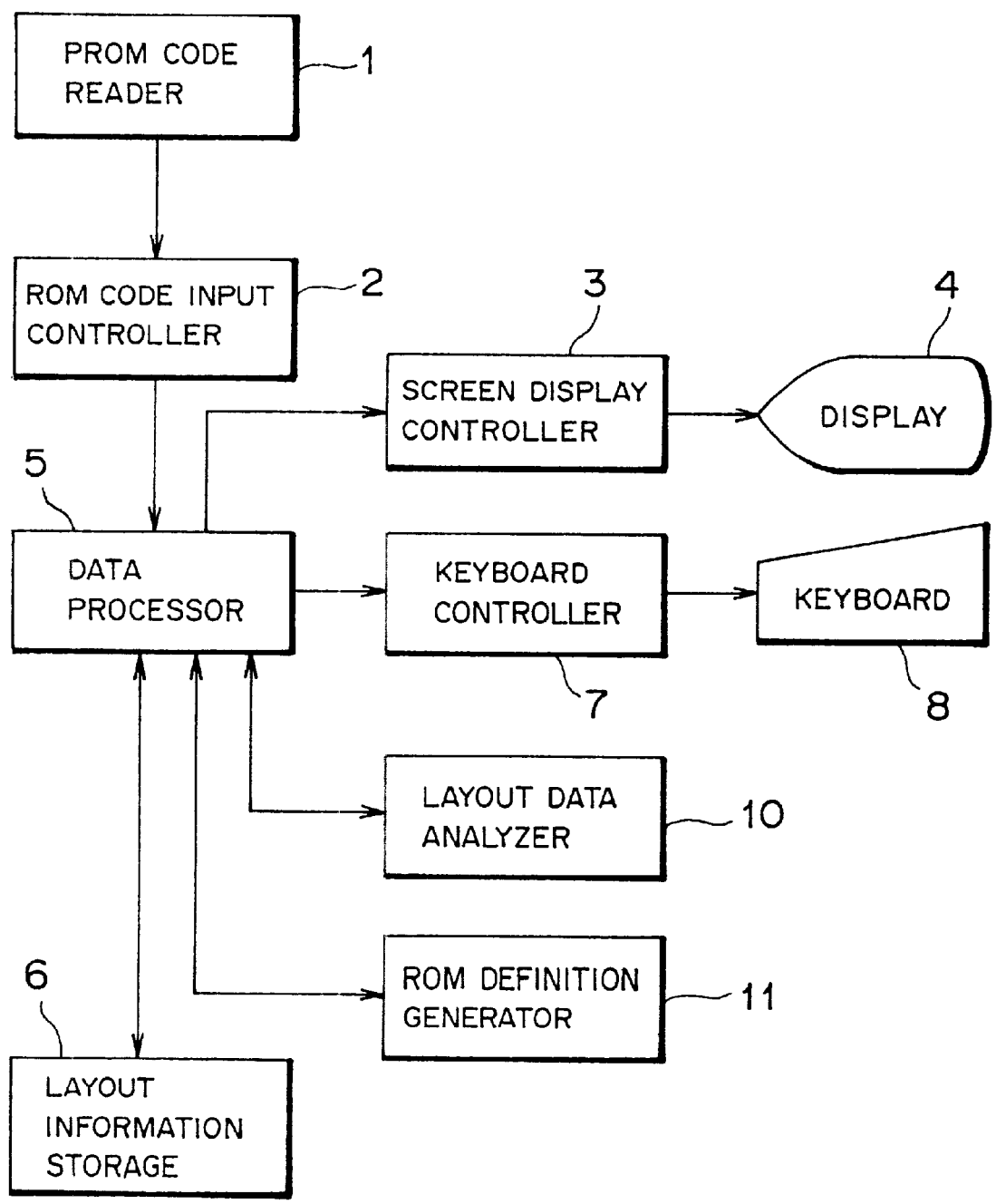
FIG. 19 is a block diagram showing the structure of a first embodiment of this invention.
Figure 20:
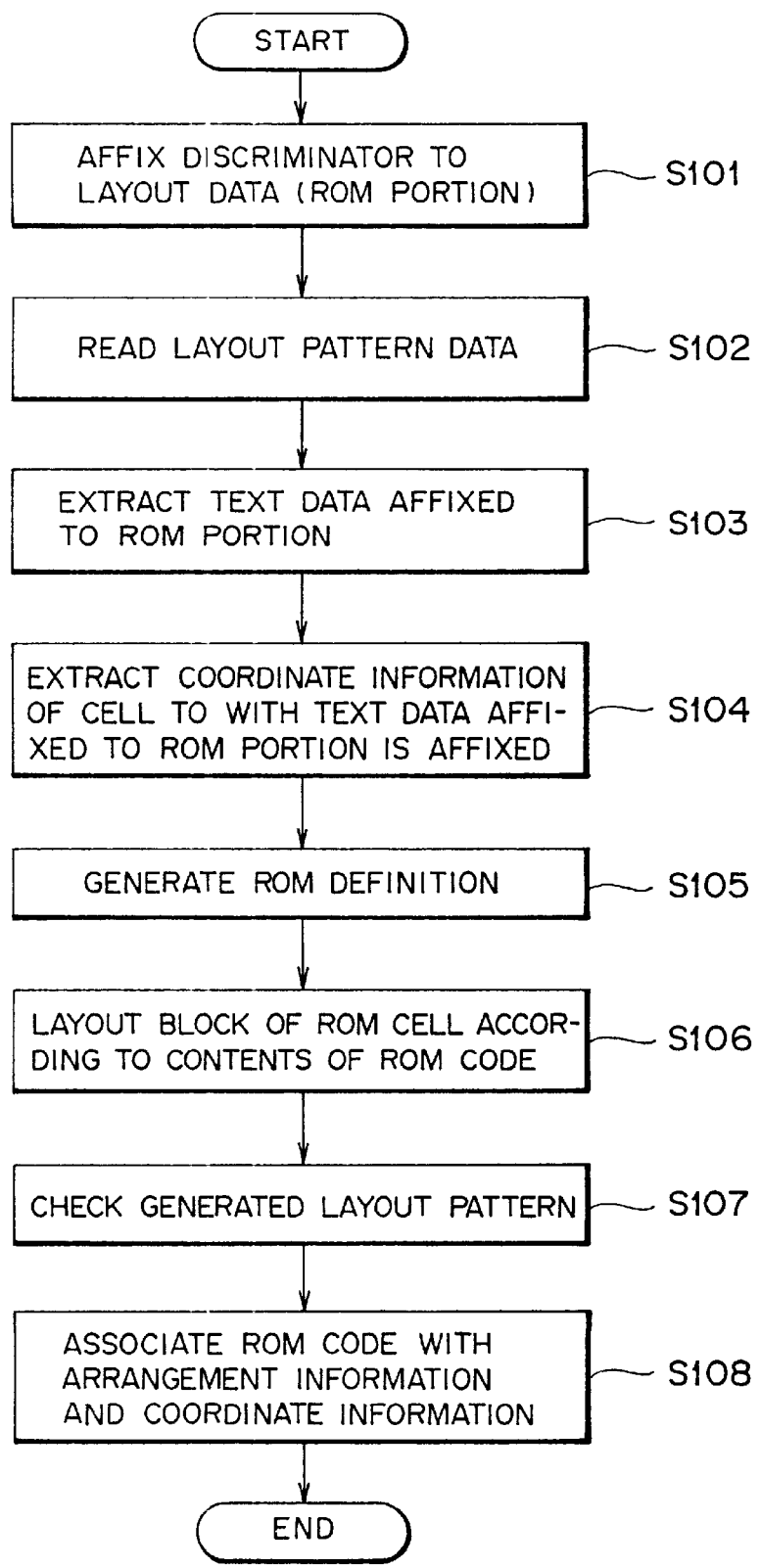
FIG. 20 is a flowchart illustrating a process flow of the first embodiment of this invention.

FIG. 19 is a block diagram showing the structure of the first embodiment of this invention. FIG. 20 is a flowchart for explaining the operation of this embodiment. FIGS. 21 through 25 are diagrams exemplarily depicting layout data with text data affixed onto ROM cells.

Referring to FIG. 19, this embodiment comprises a PROM reader 1, a ROM code input controller 2, a screen display controller 3, a display 4, a data processor 5, a layout information storage 6, a keyboard controller 7, a keyboard 8, a layout data analyzer 10 and a ROM definition generator 11.

Referring to FIG. 20, first, a designer reads basic layout data and affixes text data as a discriminator to characteristic ROM cells with respect to the address arrangement of a ROM portion (step S101). As the designer is actually carrying out the layout of the ROM, it is unnecessary to analyze the addresses.

A method of affixing text data in step S101 will be described below specifically with reference to FIGS. 21–25.

Figure 21:
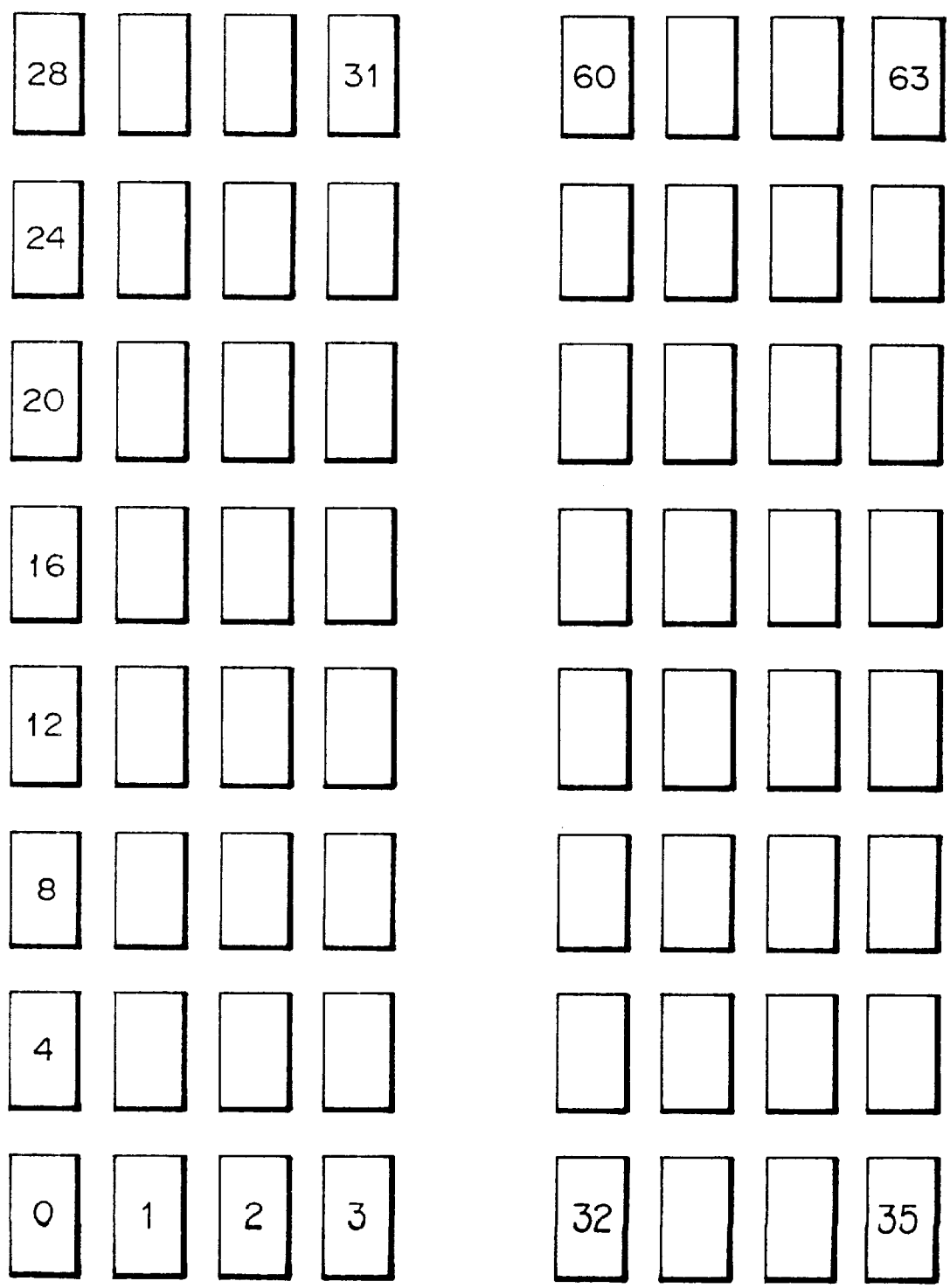
FIG. 21 is a diagram exemplarily showing layout data indicating the 0th bit of a 64-word, 8-bit ROM for explaining the first embodiment of this invention.

FIG. 21 shows a part of layout data showing the arrangement of ROM cells at the 0th bit in n bits×64 words. In FIG. 21, numerals in blocks or symbols indicating ROM cells indicate addresses corresponding to the respective ROM cells.

Referring to FIG. 21, addresses 0 to 31 are arranged four across and eight sets each of four addresses vertically in the ascending order at the same pitches, and addresses 32 to 63 are arranged like the addresses 0–31 in the mentioned arrangement shifted rightward. At this time, the designer affixes text data in the following manner.

Figure 22:
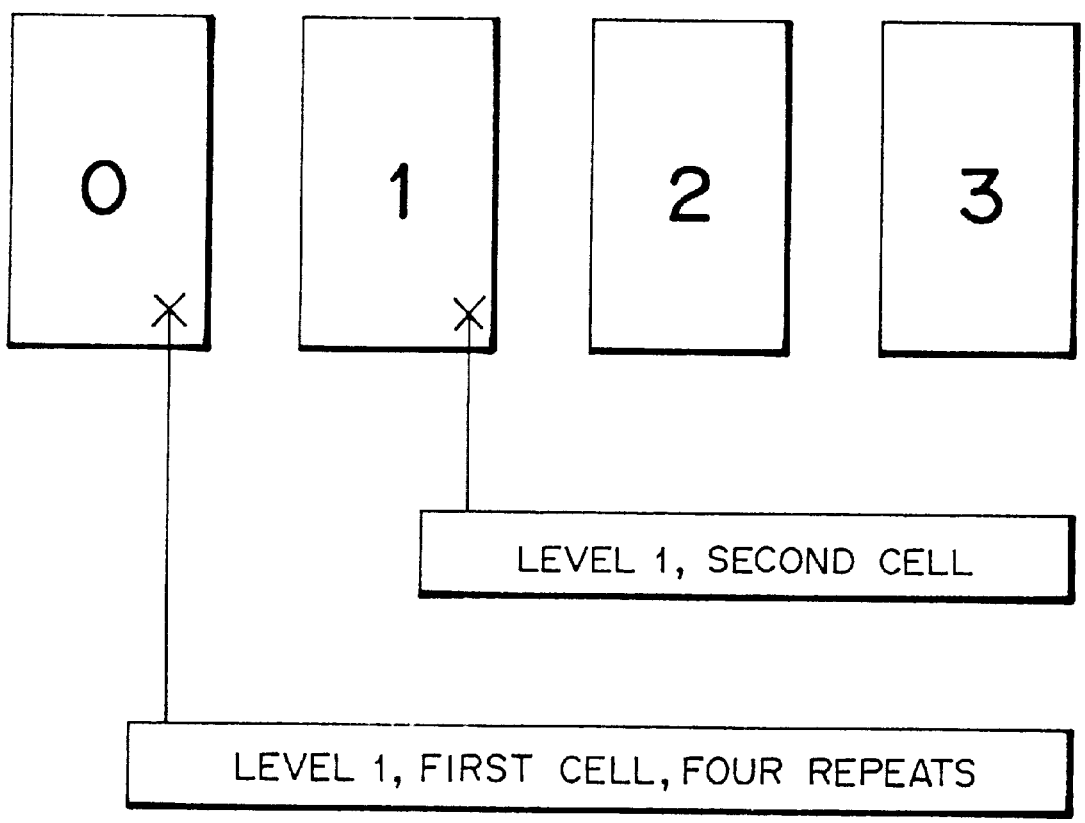
FIG. 22 is a diagram exemplarily showing layout data to which a text is affixed to define the arrangement of the 0th to third addresses in FIG. 21 for explaining the first embodiment of this invention.

To define four repeats of addresses 0–3 in the X direction, the repeat level and the number of repeats are affixed as text data to the ROM cell which becomes a reference of the 0th address. Further, text data is affixed to the second ROM cell (first address) in repetition as a mark for pitch computation. FIG. 22 exemplarily shows how the text data is affixed. Referring to FIG. 22, text data indicative of information of "level 1, first cell, four repeats" is affixed to the ROM cell at the 0th address, and text data indicative of information of "level 1, second cell" is affixed to the ROM cell at the first address.

Figure 23:
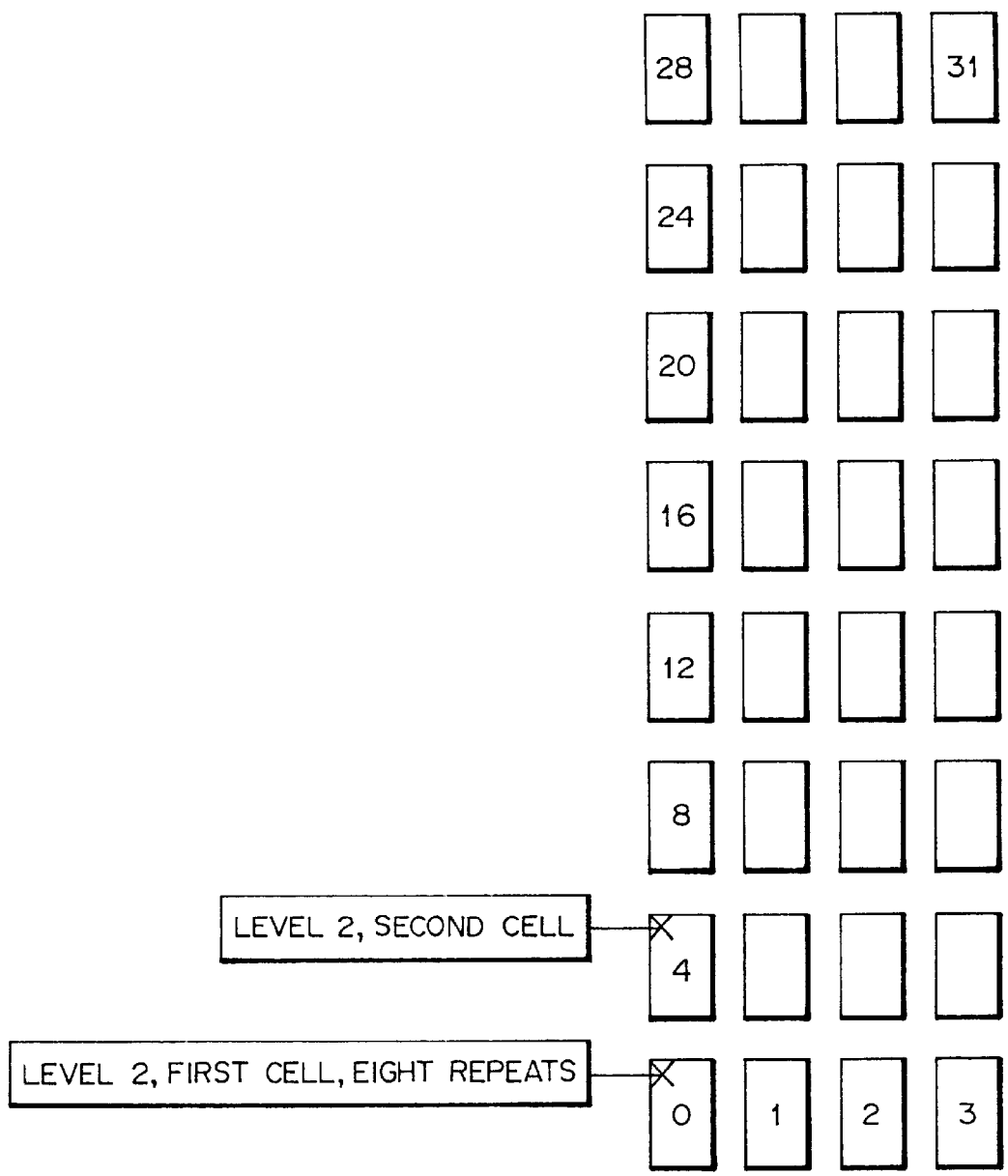
FIG. 23 is a diagram exemplarily showing layout data to which a text is affixed to define the arrangement of the 0th to 31st addresses in FIG. 21 for explaining the first embodiment of this invention.

To define eight repeats of addresses 0–31 in the Y direction at a pitch of four addresses, as in the previous case, the repeat level and the number of repeats are affixed as text data to the ROM cell at the 0th address. Further, text data is affixed to the second ROM cell (fourth address) in repetition. FIG. 23 exemplarily shows how the text data is affixed. Referring to FIG. 23, text data indicative of information of "level 2, first cell, eight repeats" is affixed to the ROM cell at the 0th address, and text data indicative of information of "level 2, second cell" is affixed to the ROM cell at the fourth address.

Figure 24:
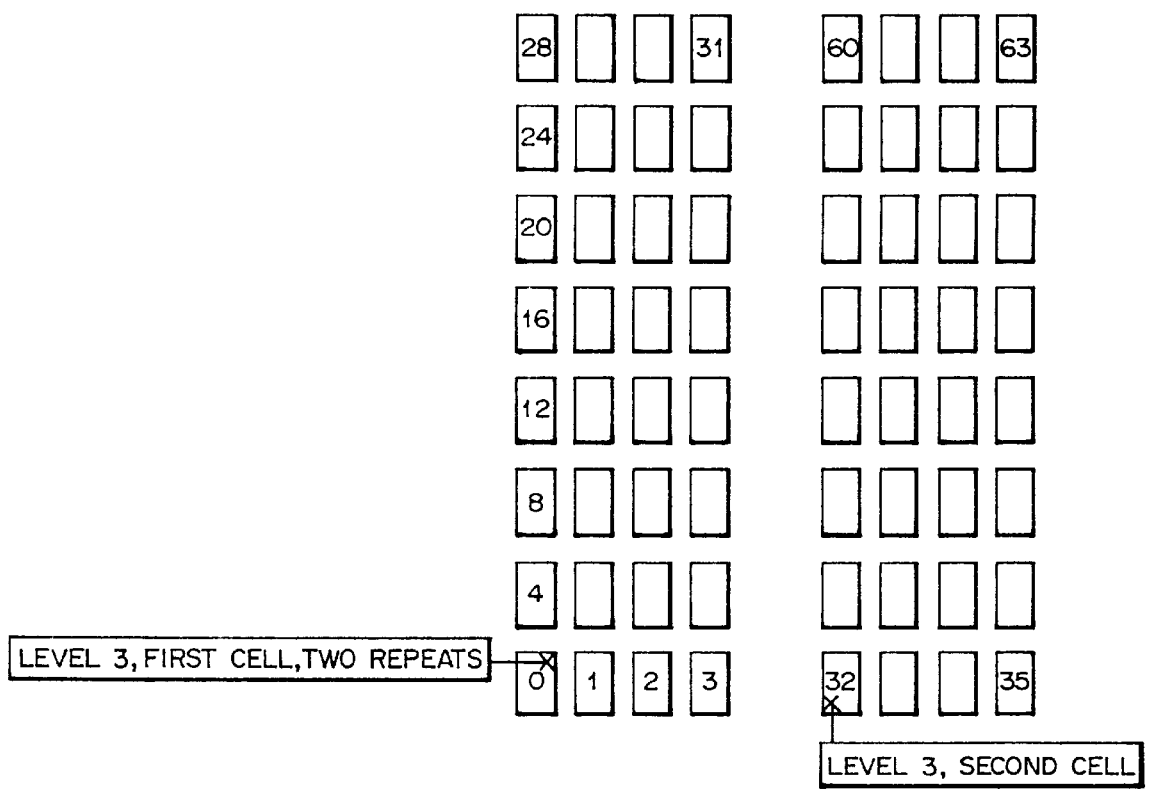
FIG. 24 is a diagram exemplarily showing layout data to which a text is affixed to define the arrangement of the 0th to 63rd addresses in FIG. 21 for explaining the first embodiment of this invention.

To define two repeats of addresses 0–63 in the X direction at a pitch of thirty-two addresses, as in the previous case, the repeat level and the number of repeats are affixed as text data to the ROM cell at the 0th address. Further, text data is affixed to the second ROM cell (32nd address) in repetition. FIG. 24 exemplarily shows how the text data is affixed. Referring to FIG. 24, text data indicative of information of "level 3, first cell, two repeats" is affixed to the ROM cell at the 0th address, and text data indicative of information of "level 3, second cell" is affixed to the ROM cell at the 32nd address.

When affixing of text data necessary to define entire the arrangement is completed, affixing of text data is completed.

Figure 25:
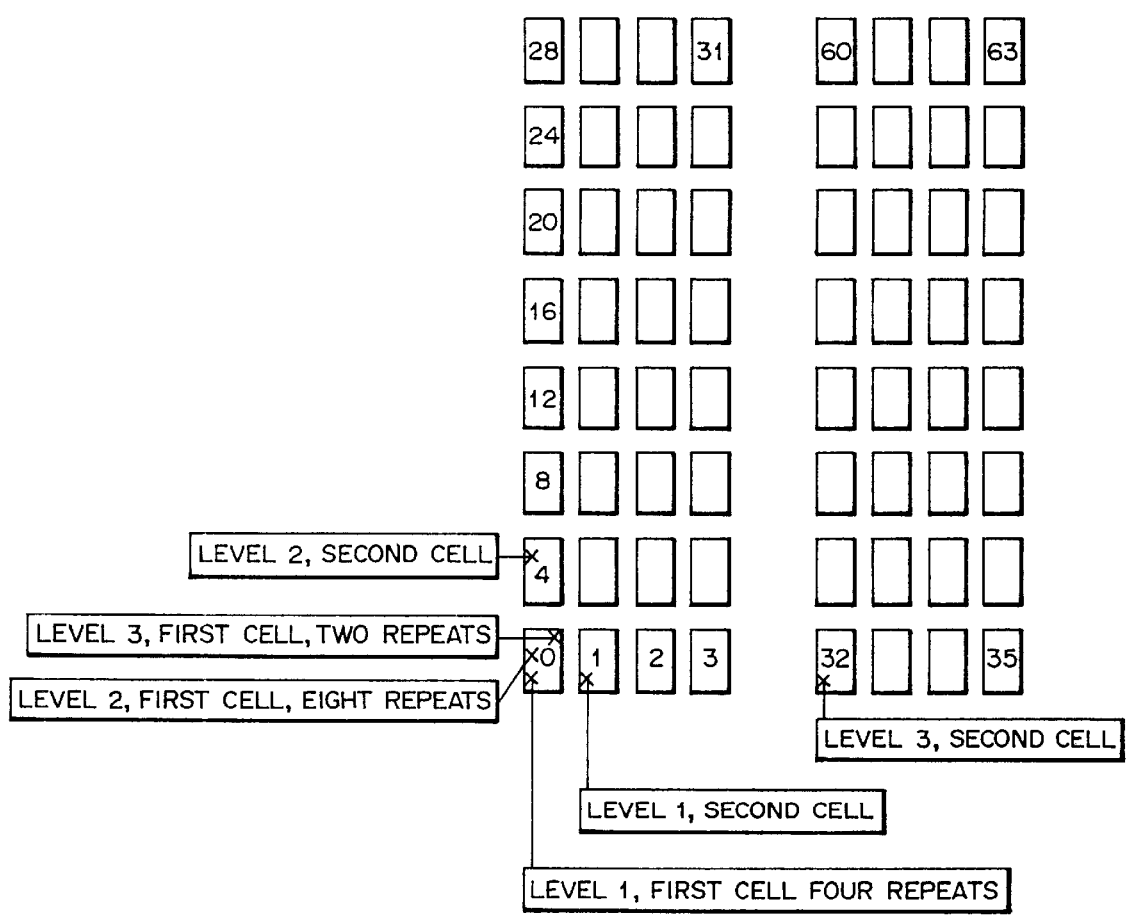
FIG. 25 is a diagram exemplarily showing layout data to which all the text data in FIGS. 21–24 are affixed.

FIG. 25 shows all text data affixed to the layout data shown in FIG. 21.

Text data is affixed in the above manner in such a way that the arrangement of the addresses of all the ROM portions can be determined.

Referring again to the flowchart in FIG. 21, the screen display controller 3 then reads layout pattern data affixed with text data in step S101 (step S102). Text data affixed to a ROM portion in the read layout pattern data is extracted (step S103).

Further, coordinate information of a ROM cell to which text data is affixed is extracted (step S104).

Using the read text data and the coordinate information extracted in step S104, a ROM definition is prepared (step S105). A detailed description will now be given of how a ROM definition is generated from a sequence of text data, exemplarily shown in, for example, FIG. 25, in step S105.

First, text data is extracted from the one of a lower repeat level. More specifically, text data of the first level is extracted. That is, the text data affixed in FIG. 24 is extracted, the size of a block of the first ROM cell is acquired from that cell, and the pitch between cells is automatically computed from the coordinates (base coordinates) of the first cell and the coordinate information of the second cell.

Figure 26:
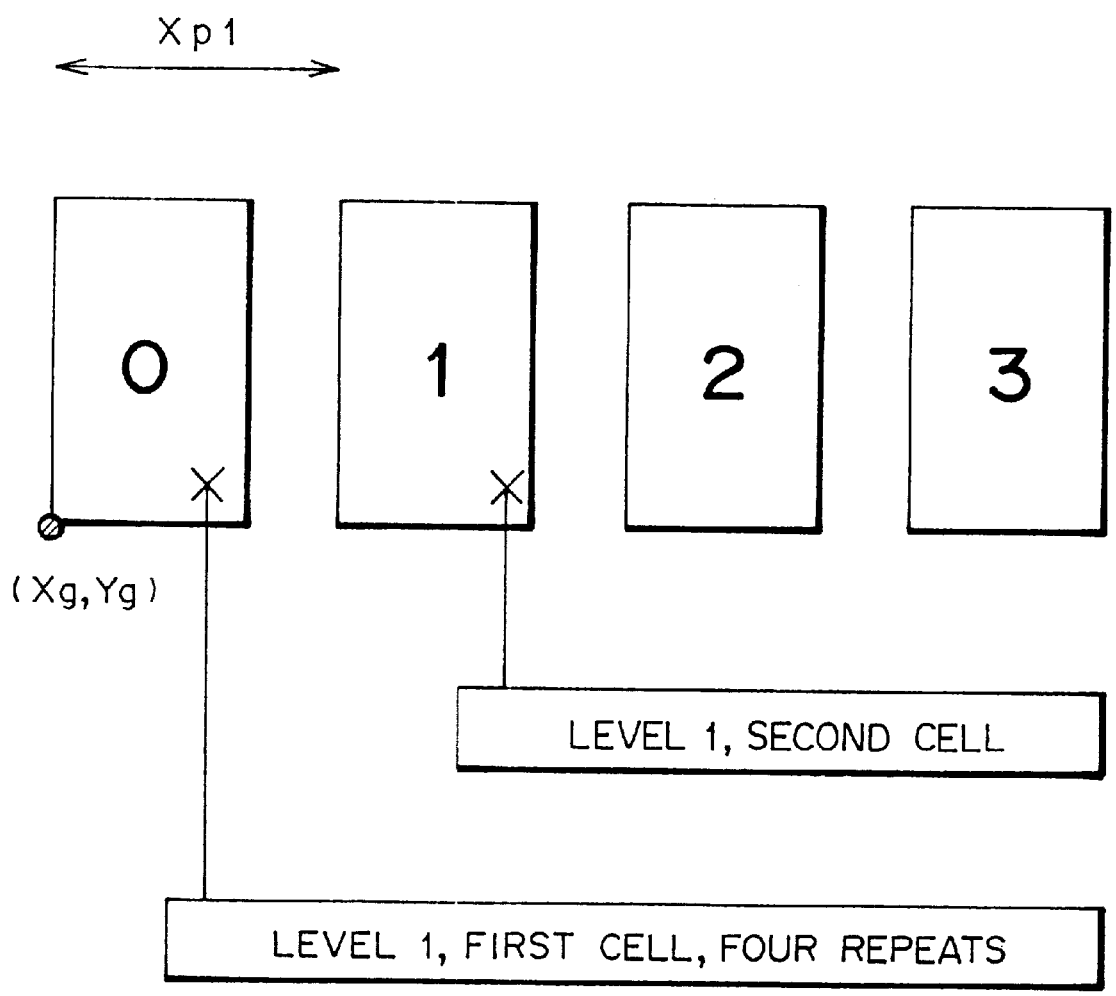
FIG. 26 is a diagram exemplarily showing a ROM definition which is acquired from text data affixed in FIG. 22 for explaining the first embodiment of this invention.

Through the above-described process, a ROM definition as shown in FIG. 26 is generated. (Note that the definition of the block sizes of ROM cells is prepared separately as a common one to individual ROM definitions.) Referring to FIG. 26, with regard to the arrangement (array) with the base coordinates (Xg, Yg), the address bit (0, 0) and level 1, definition information specifying the direction as the X direction, the pitch of Xp1, the repeat number of 4 and the address pitch of 1 is generated.

Figure 27:
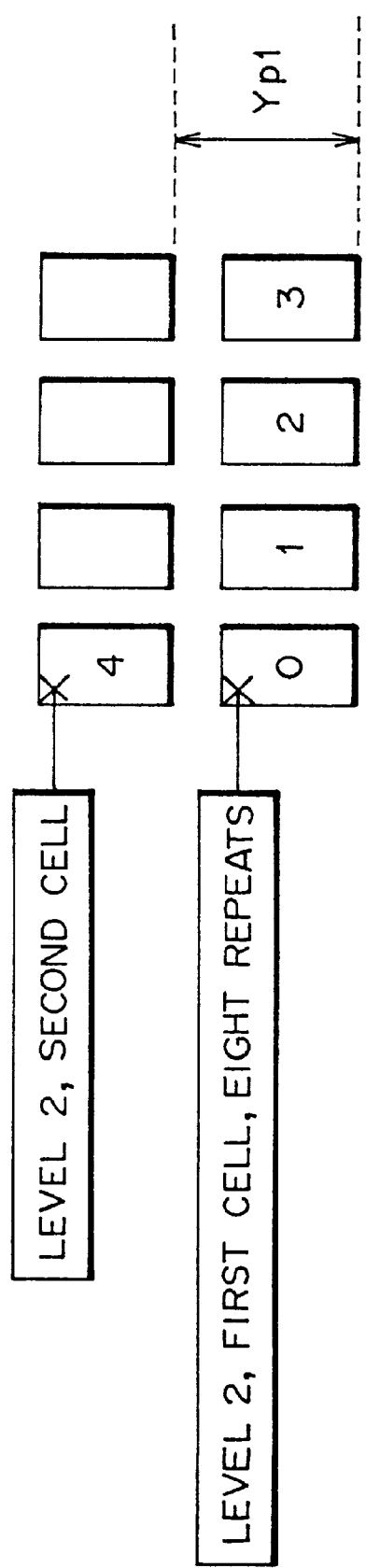
FIG. 27 is a diagram exemplarily showing a ROM definition which is acquired from text data affixed in FIG. 23 for explaining the first embodiment of this invention.

Likewise, as regards the second level, the pitch and address pitch are computed from the text data affixed in FIG. 23. Through this process, a ROM definition as shown in FIG. 27 is generated. Referring to FIG. 27, with regard to the arrangement with level 2, definition information specifying the direction as the Y direction, the pitch of Yp1, the repeat number of 8 and the address pitch of 4 is generated.

Figure 28:
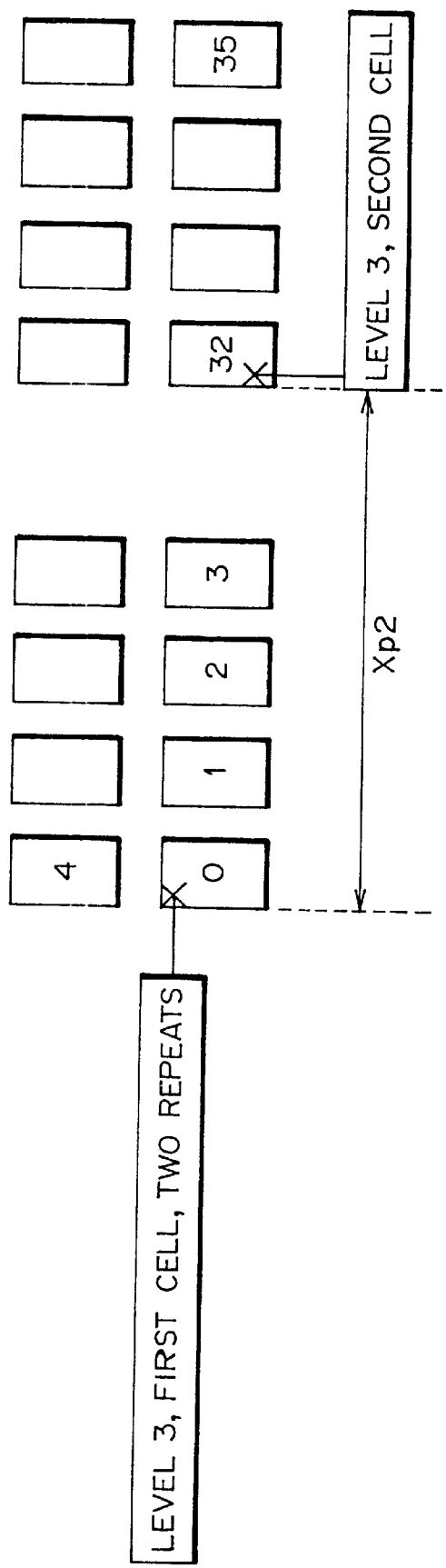
FIG. 28 is a diagram exemplarily showing a ROM definition which is acquired from text data affixed in FIG. 24 for explaining the first embodiment of this invention.

Likewise, as regards the third level, a ROM definition as shown in FIG. 28 is generated. Referring to FIG. 28, with regard to the arrangement with level 3, definition information specifying the direction as the X direction, the pitch of Xp2, the repeat number of 2 and the address pitch of 32 is generated.

In step S105, as a ROM definition corresponding to layout data which shows the arrangement of the ROM at the 0th bit in n bits×64 words shown in FIG. 21, a ROM definition shown in FIG. 29 is generated as definition information which is a combination of ROM definitions shown in FIGS. 26–28.

Referring again to FIG. 30, then, the PROM code reader 1 reads a ROM code via the ROM code input controller 2 (step S106). In accordance with the read ROM code, the designated block is laid out and is stored in the layout information storage 6 (step S107).

Then, the prepared layout pattern is displayed on the display 4 for the confirmation of this layout pattern under the control of the screen display controller 3 (step S108).

Figure 30:
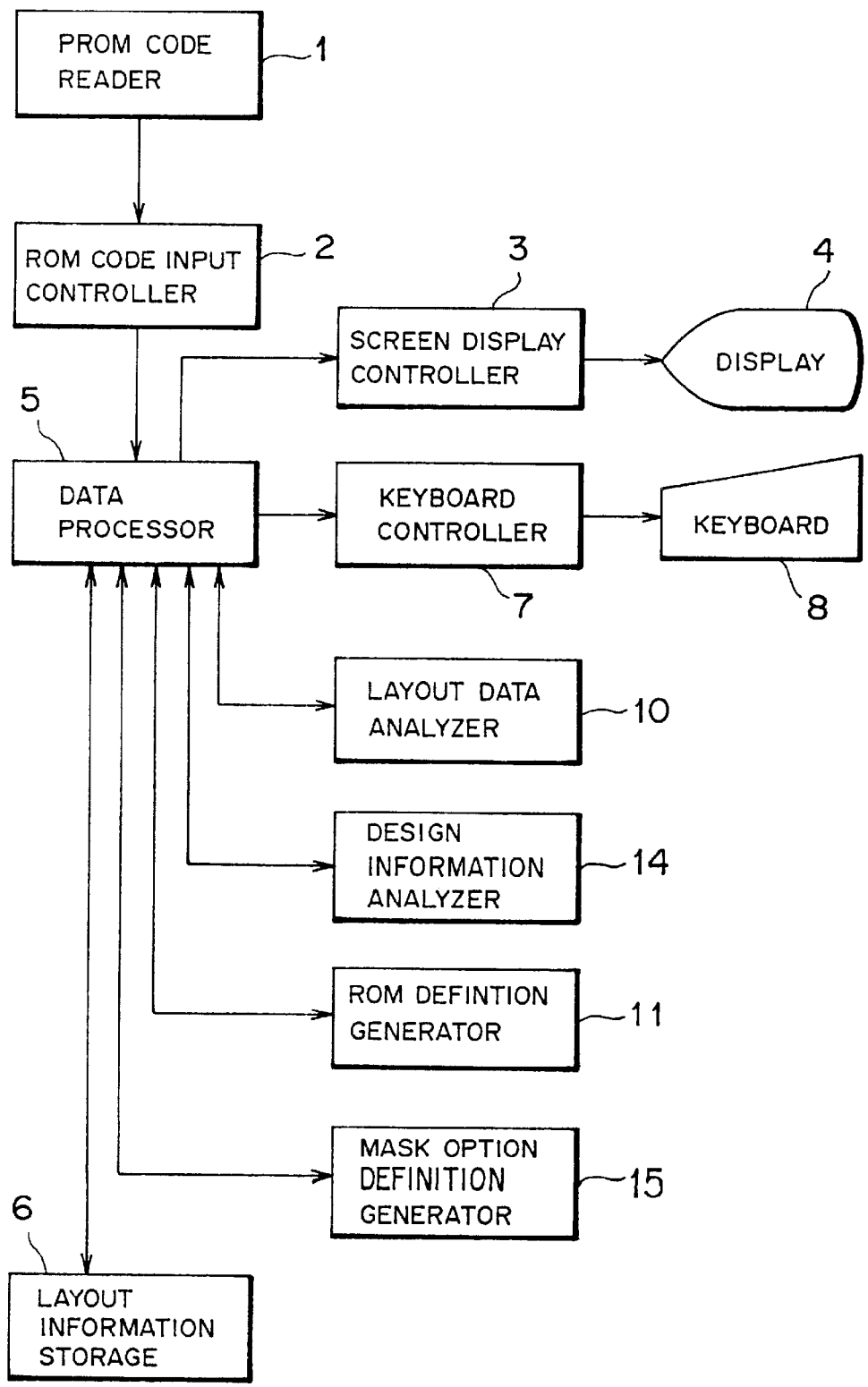
FIG. 30 is a block diagram showing the structure of a second embodiment of this invention.
Figure 31:
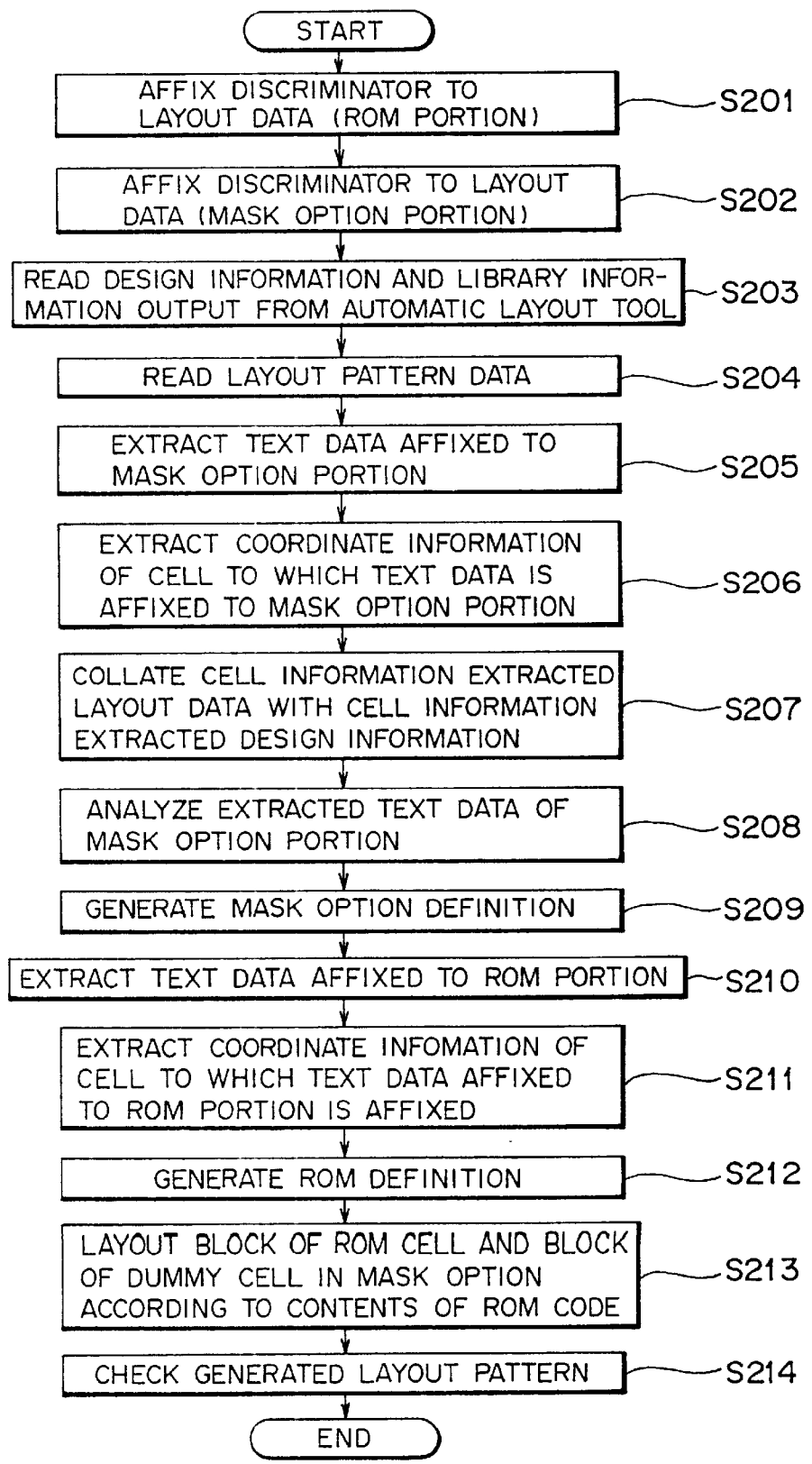
FIG. 31 is a flowchart illustrating a process flow of the second embodiment of this invention.

The second embodiment of this invention will now be discussed. FIG. 30 is a block diagram showing the structure of the second embodiment of this invention. FIG. 31 is a flowchart for explaining the operation of this embodiment.

Referring to FIG. 30, this embodiment comprises a PROM reader 1, a ROM code input controller 2, a screen display controller 3, a display 4, a data processor 5, a layout information storage 6, a keyboard controller 7, a keyboard 8, a layout data analyzer 10, a design information analyzer 14, a ROM definition generator 11 and a mask option definition generator 15.

Referring to FIG. 31, first, a designer reads basic layout data and affixes text data as a discriminator to characteristic ROM cells with respect to the address arrangement of a ROM portion (step S201). As this step S201 is the same as the step S101 in the first embodiment which has already been described with reference to FIG. 20, its description will be omitted.

Next, the designer reads basic layout data and affixes necessary information, such as the type of a mask option and the address of associated input ROM data, to a dummy cell in the mask option portion in the layout data as text data (step S202).

Figure 32:
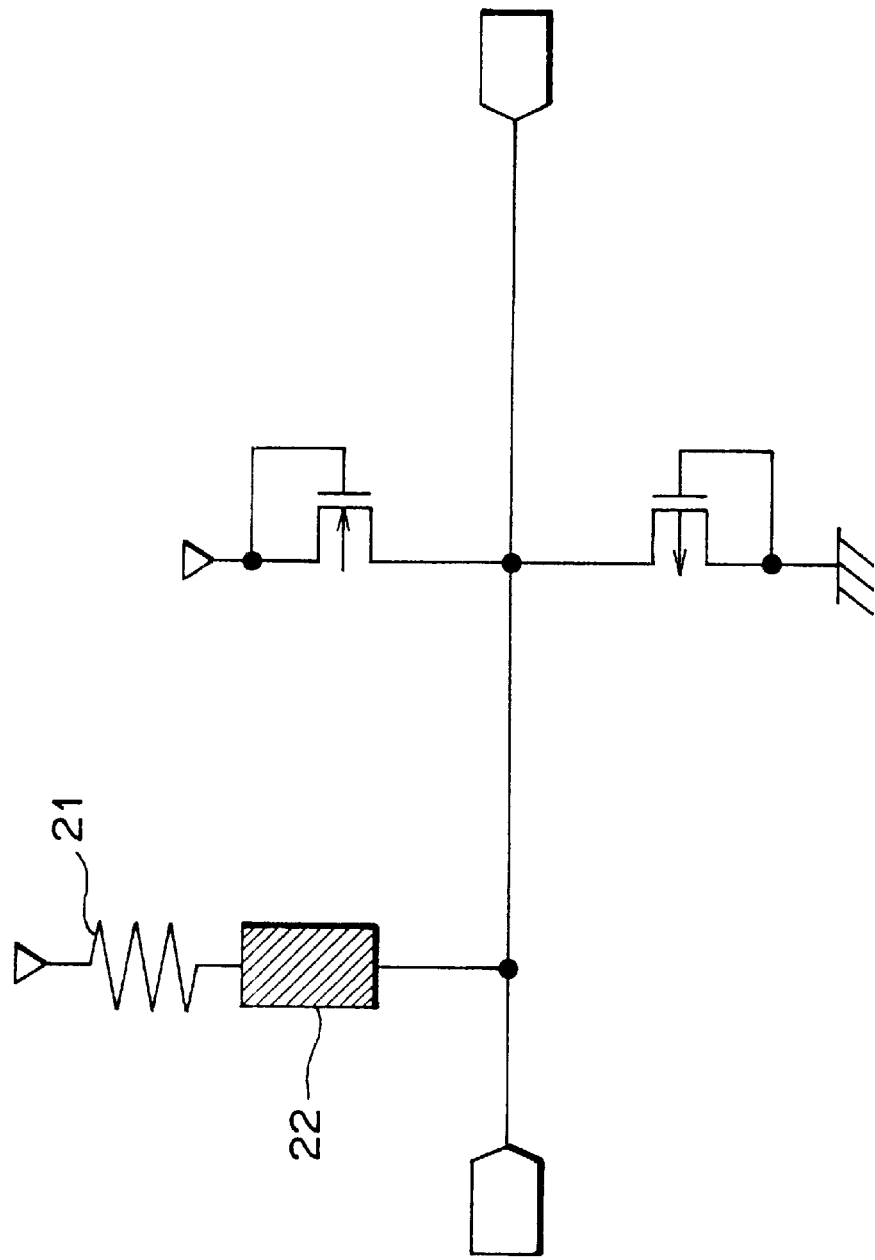
FIG. 32 is an exemplary diagram of layout data including a mask option (provision/omission of a pull-up resistor) for explaining the second embodiment of this invention.
Figure 33:
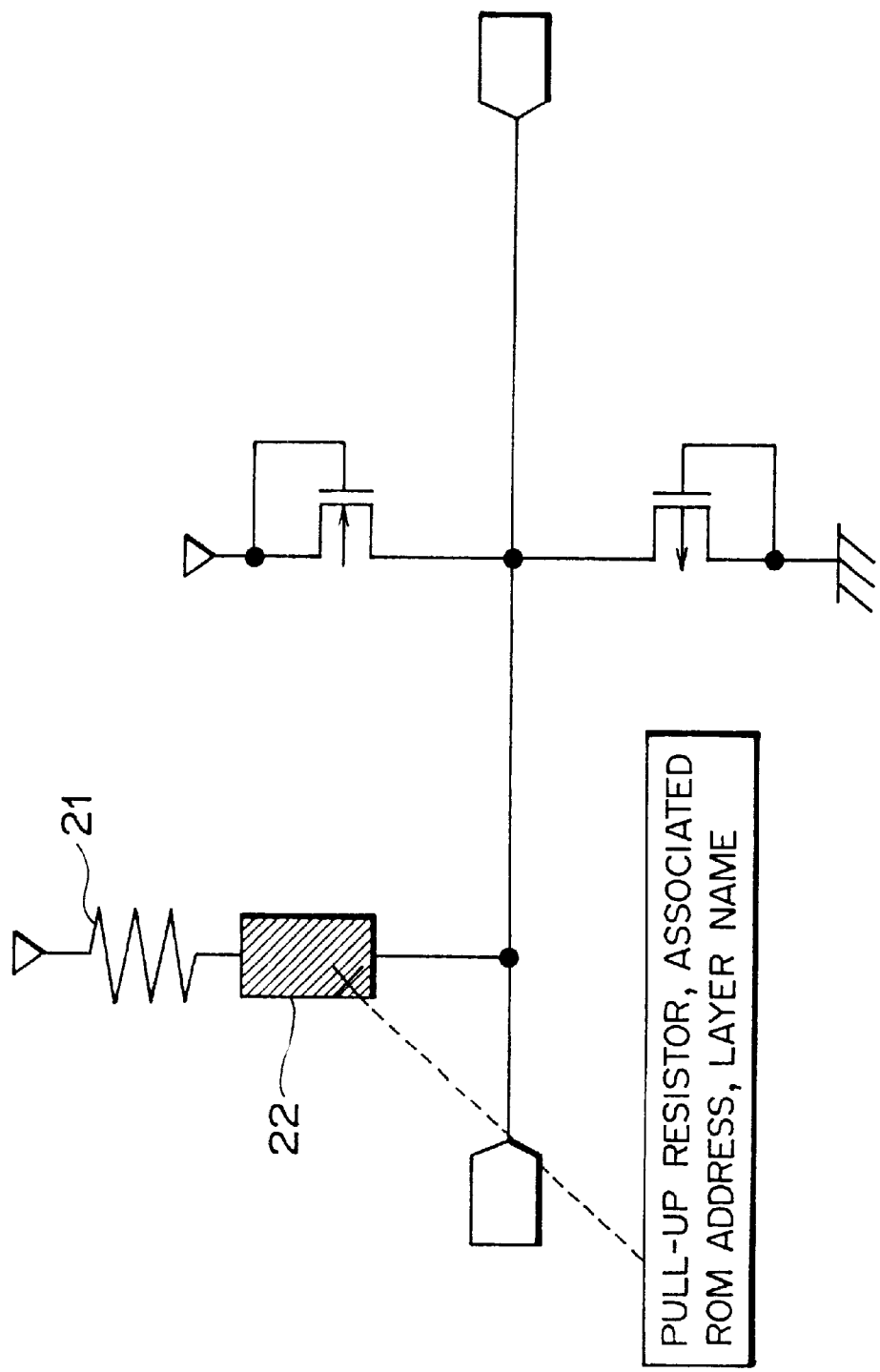
FIG. 33 is a diagram exemplarily showing layout data to which text data is affixed to the circuit in FIG. 32 for a mask option for explaining the second embodiment of this invention.

A description will now be given of how to affix text data with reference to FIGS. 32, 33 and 34. Of those figures, FIG. 32 shows a part of actual layout data and an example where there is a mask option (existence/non-existence of a pull-up resistor).

The designer affixes the type of the mask option, the associated ROM data address and the layout layer of the cell as text data to this dummy cell. FIG. 33 shows how text data is affixed to the dummy cell. Referring to FIG. 33, information of "pull-up resistor, associated ROM address, layout layer name" is affixed as text data to a dummy cell 22.

Referring again to FIG. 31, then, the data processor 5 reads design information and library information, output from an automatic layout tool, and extracts all cell information present on the layout (step S203).

Next, the data processor 5 reads layout pattern data with text data affixed in steps S201 and S202 (step S204).

Then, the text data affixed to the mask option portion is extracted first from the read layout data (step S205).

Further, cell information in the mask option portion is extracted (step S206), and is collated with the cell information extracted in steps S203 and S206 to specify the mask option portion (step S207).

The text data extracted in step S205 is analyzed (step S208) to generate a mask option definition (step S209). FIG. 34 shows the mask option definition generated in step S209.

Further, a process of generating a ROM definition for the ROM portion or a process sequence from step S210 to step S212 is executed. Because this process is the same as the process from step S103 to step S105 in the first embodiment, its description will be omitted.

When the ROM definition and mask option definition are completed, the block of the ROM cell and the block of the mask option are laid out in accordance with the contents of the input ROM code (step S213). Finally, the generated layout pattern is checked (step S214) after which the processing will be terminated.

As apparent from the above, this invention has the following advantages.

(1) The first advantage of this invention can significantly reduce the number of processing steps and processing time required for extraction of arrangement information and coordinate information as compared with the manual extraction done in the prior arts, and can prevent errors originated from a manual work.

This is because in this invention, a discriminator is affixed as text information to a ROM portion and a mask option portion so that a ROM definition as arrangement information and coordinate information of each ROM cell and a mask option definition as arrangement information and coordinate information of a dummy cell in a mask option are automatically extracted.

(2) To quantitatively explain a specific advantage of this invention, it takes about two weeks by a manual work to check arrangement information and coordinate information of a ROM portion from layout data, compute a pitch and generate a ROM definition and a mask option definition, whereas this invention, it is expected, completes all the processes including inspection in about two days.

(3) Another advantage of this invention eliminates the need for logic simulation which has been employed conventionally, making it possible to eliminate the preparation steps and time corresponding to the execution of logic simulation and provide an apparatus which provides a high design quality without performing this logic simulation.

(4) A further advantage of this invention eliminates the need for manual extraction of arrangement information and coordinate information for a mask option, thereby ensuring reduction in a significant number of steps and considerable time. This can further reduce man-made errors.

This is achieved by the structure of this invention to automatically generate a mask option definition as a layout definition of a dummy cell associated with a mask option.

What is claimed is:

1. A layout information generating apparatus comprising:

a first unit for adding, as an identifier, text data containing information about an array structure to a representative ROM cell section showing features of an address bit array of a ROM portion of layout data; said array structure having a plurality of repeat patterns each containing a plurality of ROM cells, said text data including, for each initial ROM cell within a repeat pattern, a repeat level number corresponding to each repeat pattern, a number of repeats corresponding to the repeat level number and a ROM cell number, and said text data including, for each other ROM cell, said repeat level number and said ROM cell number;

a second unit for adding, as an identifier to generate patterns, text data containing mask option coordinate information to all mask option portions of the layout data;

a third unit for reading design information and library information, which are outputted from an automatic layout tool;

a fourth unit for reading layout data containing the text data added by said first and second units, and for extracting ROM cell information and mask option information from said respective text data;

a fifth unit for specifying mask option portions on the basis of said design information and library information read by said third unit and said ROM cell information extracted by said fourth unit;

a sixth unit for generating ROM definitions to generate ROM mask patterns on the basis of said ROM cell information; said ROM definitions including, for each repeat pattern, the repeat level number, an X or Y direction, an X or Y pitch, said number of repeats corresponding to said repeat level number and a pitch address specifying the initial ROM cell of the repeat pattern corresponding to said repeat level number; and a seventh unit for generating mask option definitions to generate mask patterns of the mask option portions.

2. A method for generating layout information, in which a data processing apparatus is employed, said method comprising the steps of:

(a) reading layout data from a memory in which the layout data are stored; adding, as an identifier, text data containing information about an array structure to a representative ROM cell section showing features of an address bit array of a ROM portion of said layout data; adding, as an identifier to generate patterns, text data containing mask option coordinate information to all mask option portions of said layout data; said array structure having a plurality of repeat patterns each containing a plurality of ROM cells, said text data including, for each initial ROM cell within a repeat pattern, a repeat level number corresponding to each repeat pattern, a number of repeats corresponding to the repeat level number and a ROM cell number, and said text data including, for each other ROM cell, said repeat level number and said ROM cell number;

(b) reading design information and library information outputted from an automatic layout tool to said memory;

(c) reading from said memory said layout containing the text data added by said step (a), and extracting ROM cell information and mask option information from said respective text data;

(d) specifying mask option portions on the basis of said design information and library information read in said step (b), and said ROM cell information extracted in said step (c);

(e) generating ROM definitions to generate ROM mask patterns on the basis of said ROM cell information and storing the same in a memory; said ROM definitions including, for each repeat pattern, the repeat level number, an X or Y direction, an X or Y pitch, said number of repeats corresponding to said repeat level number and a pitch address specifying the initial ROM cell of the repeat pattern corresponding to said repeat level number; and (f) generating mask option definitions to generate mask patterns of the mask option portions and storing the same in a memory.

3. A recording medium having a program recorded thereon for causing an information processing apparatus to execute following processes (a) to (f) to generate layout information:

(a) a process of reading layout data from a memory in which the layout data are stored; adding, as an identifier, text data containing information about an array structure to a representative ROM cell section showing features of an address bit array of a ROM portion of said layout data; adding, as an identifier to generate patterns, text data containing mask option coordinate information, to all mask option portions of said layout data; said array structure having a plurality of repeat patterns each containing a plurality of ROM cells, said text data including, for each initial ROM cell within a repeat pattern, a repeat level number corresponding to each repeat pattern, a number of repeats corresponding to the repeat level number and a ROM cell number, and said text data including, for each other ROM cell, said repeat level number and said ROM cell number;

(b) a process of reading design information and library information outputted from an automatic layout tool to said memory;

(c) a process of reading from said memory said layout containing the text data added by said process (a), and extracting ROM cell information and mask option information from said respective text data;

(d) a process of specifying mask option portions on the basis of said design information and library information read in said process (b), and said ROM cell information extracted in said process (c);

(e) a process of generating ROM definitions to generate ROM mask patterns on the basis of said ROM cell information and storing the same in a memory; said ROM definitions including, for each repeat pattern, the repeat level number, an X or Y direction, an X or Y pitch, said number of repeats corresponding to said repeat level number and a pitch address specifying the initial ROM cell of the repeat pattern corresponding to said repeat level number; and (f) a process of generating mask option definitions to generate mask patterns of the mask option portions and storing the same in a memory.

4. A layout information generating apparatus comprising:

first means for adding, as an identifier, text data containing information about an array structure to a representative ROM cell section showing features of an address bit array of a ROM portion of layout data;

second means for adding, as an identifier to generate patterns, text data containing mask option coordinate information to all mask option portions of the layout data; said array structure having a plurality of repeat patterns each containing a plurality of ROM cells, said text data including, for each initial ROM cell within a repeat pattern, a repeat level number corresponding to each repeat pattern, a number of repeats corresponding to the repeat level number and a ROM cell number, and said text data including, for each other ROM cell, said repeat level number and said ROM cell number;

third means for reading design information and library information, which are outputted from an automatic layout tool;

fourth means for reading layout data containing the text data added by said first and second means, and for extracting ROM cell information and mask option information from said respective text data;

fifth means for specifying mask option portions on the basis of said design information and library information read by said third means and said ROM cell information extracted by said fourth means;

sixth means for generating ROM definitions to generate ROM mask patterns on the basis of said ROM cell information; said ROM definitions including, for each repeat pattern, the repeat level number, an X or Y direction, an X or Y pitch, said number of repeats corresponding to said repeat level number and a pitch address specifying the initial ROM cell of the repeat pattern corresponding to said repeat level number; and seventh means for generating mask option definitions to generate mask patterns of the mask option portions.

* * * * *